United States Patent
Kim et al.

(10) Patent No.: US 10,236,418 B2
(45) Date of Patent: Mar. 19, 2019

(54) LIGHT-EMITTING ELEMENT COMPRISING A PLURALITY OF WAVELENGTH CONVERTERS, AND PRODUCTION METHOD THEREFOR

(71) Applicant: SEOUL VIOSYS CO., LTD., Ansan-si (KR)

(72) Inventors: Chang Yeon Kim, Ansan-si (KR); Jong Hyeon Chae, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/847,735

(22) Filed: Dec. 19, 2017

(65) Prior Publication Data
US 2018/0190871 A1    Jul. 5, 2018

Related U.S. Application Data

(63) Continuation of application No. PCT/KR2016/006292, filed on Jun. 14, 2016.

(30) Foreign Application Priority Data

Jun. 19, 2015 (KR) .................. 10-2015-0087539

(51) Int. Cl.
*H01L 33/38* (2010.01)
*H01L 33/36* (2010.01)
(Continued)

(52) U.S. Cl.
CPC ...... *H01L 33/387* (2013.01); *H01L 21/02274* (2013.01); *H01L 33/10* (2013.01);
(Continued)

(58) Field of Classification Search
CPC ..... H01L 33/50; H01L 33/501; H01L 33/502; H01L 33/504
See application file for complete search history.

(56) References Cited

U.S. PATENT DOCUMENTS

2014/0252388 A1*  9/2014  Kimura ............... H01L 33/502
                                                   257/98
2014/0252389 A1*  9/2014  Koizumi .............. H01L 33/005
                                                   257/98

FOREIGN PATENT DOCUMENTS

JP    2010-177225 A    8/2010
JP    2012-019201 A    1/2012
(Continued)

OTHER PUBLICATIONS

International Search Report in PCT/KR2016/006292, dated Nov. 2, 2016.

*Primary Examiner* — Mohammed R Alam
(74) *Attorney, Agent, or Firm* — Perkins Coie LLP

(57) ABSTRACT

Disclosed are a light-emitting element and a production method therefor. In one aspect, a light-emitting element is provided to comprise a light-emitting structure comprising a first and second semiconductor layers and an active layer; a first and second contact electrodes respectively making ohmic contact with the first and second semiconductor layers; an insulating layer for insulating the first contact electrode and second contact electrode; a first and second bulk electrodes respectively electrically linked to the first and second contact electrodes; an insulating support covering the side surfaces of the first and second bulk electrodes; a first wavelength converter covering the light-emitting structure; a light-transmitting layer positioned on the first wavelength converter; and a second wavelength converter positioned on the light-transmitting layer, and, in the present invention, white light emitted from the light-emitting element has a CIEx value of at least 0.390 on the CIE color coordinate chart.

12 Claims, 29 Drawing Sheets

(51) Int. Cl.
*H01L 33/50* (2010.01)
*H01L 21/02* (2006.01)
*H01L 33/10* (2010.01)
*H01L 33/40* (2010.01)
*H01L 33/42* (2010.01)

(52) U.S. Cl.
CPC ............ *H01L 33/36* (2013.01); *H01L 33/405* (2013.01); *H01L 33/42* (2013.01); *H01L 33/50* (2013.01)

(56) References Cited

FOREIGN PATENT DOCUMENTS

| | | |
|---|---|---|
| JP | 2013-526007 A | 6/2013 |
| JP | 2015-008329 A | 1/2015 |
| KR | 10-2015-0018481 A | 2/2015 |

\* cited by examiner (a)

(b)

(a)

(b)

(a)          (b)

(a)

(b)

(a)

(b)

(a)

(b)

(a)

(b)

(a)

(b)

(a)

(b)

(a)

(b)

(a)

(b)

LIGHT-EMITTING ELEMENT COMPRISING A PLURALITY OF WAVELENGTH CONVERTERS, AND PRODUCTION METHOD THEREFOR

CROSS-REFERENCE TO RELATED APPLICATIONS

The present application is a continuation of and claims the benefits and priority to International Patent Application No. PCT/KR2016/006292, filed on Jun. 14, 2016, and claims further priority to Korean Patent Application No. 10-2015-0087539, filed Jun. 19, 2015

TECHNICAL FIELD

Exemplary embodiments of the present disclosure relate to a light emitting element and a method of manufacturing the same. Some implementations of the disclosed technology are related to a light emitting element that includes a plurality of wavelength converters to improve luminous efficacy, and a method of manufacturing the same.

BACKGROUND

Recently, with increasing demand for small, high power light emitting elements, there is increasing need for a large flip chip type light emitting element having good heat dissipation efficiency. A flip chip type light emitting element includes an electrode directly bonded to a secondary substrate and does not employ a wire for supplying external power to the flip chip type light emitting element, thereby providing much better heat dissipation efficiency than a horizontal light emitting element. Therefore, the flip chip type light emitting element allows effective heat transfer towards the secondary substrate upon application of high density current thereto and thus can be suitably used as a high power light source.

Furthermore, in order to achieve size reduction and high output of a light emitting element, there is increasing demand for a chip scale package that uses a light emitting element as a package by omitting a process of packaging the light emitting element in a separate housing. Particularly, since the electrode of the flip chip type light emitting element can act as a lead of the package, the flip chip type emitting device can be advantageously applied to such a chip scale package.

Generally, a white light source employing a light emitting diode uses phosphors that convert wavelengths of light emitted from the light emitting diode.

SUMMARY

Exemplary embodiments of the present disclosure provide a white light emitting element having good luminous efficacy and a method of manufacturing the same.

Exemplary embodiments of the present disclosure provide a light emitting element, which can emit white light of a specific color temperature and includes relatively thin wavelength converters to improve luminous efficacy, and a method of manufacturing the same.

In accordance with one aspect of the present disclosure, a light emitting element including a plurality of wavelength converters includes: a light emitting structure including a first conductive type semiconductor layer, a second conductive type semiconductor layer, and an active layer interposed between the first conductive type semiconductor layer and the second conductive type semiconductor layer; a first contact electrode and a second contact electrode disposed under the light emitting structure and forming ohmic contact with the first and second conductive type semiconductor layers, respectively; an insulating layer insulating the first contact electrode and the second contact electrode from each other and partially covering the first and second contact electrodes; a first bulk electrode and a second bulk electrode disposed under the light emitting structure and the insulating layer and electrically connected to the first and second contact electrodes, respectively; an insulating supporter covering side surfaces of the first bulk electrode and the second bulk electrode while at least partially exposing lower surfaces of the first bulk electrode and the second bulk electrode; a first wavelength converter covering at least part of a side surface and an upper surface of the light emitting structure; a translucent layer disposed on the first wavelength converter; and a second wavelength converter disposed on the translucent layer, wherein white light emitted from the light emitting element has a CIEx value of 0.390 or more in the CIE standard chromaticity coordinates.

The first wavelength converter may partially adjoin the insulating supporter.

The first wavelength converter may cover the side surface of the light emitting structure and adjoin at least one of the insulating layer and the first contact electrode, and a lower surface of a portion of the first wavelength converter covering the side surface of the light emitting structure may adjoin the insulating supporter.

A side surface of the first wavelength converter may be flush with a side surface of the insulating supporter.

The first wavelength converter may extend to cover at least part of a side surface of the insulating supporter.

A lower surface of the first wavelength converter may be flush with a lower surface of the insulating supporter.

A lower surface of a portion of the first wavelength converter covering the side surface of the light emitting structure may adjoin at least one of the first contact electrode and the insulating layer and be spaced apart from the insulating supporter.

The translucent layer may include a wavelength filter.

The wavelength filter may transmit light subjected to wavelength conversion by the first wavelength converter and light emitted from the light emitting structure while reflecting at least a fraction of light subjected to wavelength conversion by the second wavelength converter.

Each of the first wavelength converter and the second wavelength converter may have a thickness of 20 μm to 200 μm.

The translucent layer may have a larger thickness than the first and second wavelength converters.

The light emitting element may further include an additional translucent layer disposed on the second wavelength converter, and the additional translucent layer may include at least one protrusion formed at an upper side thereof.

The light subjected to wavelength conversion by the second wavelength converter may have a longer wavelength than the light subjected to wavelength conversion by the first wavelength converter.

In accordance with another aspect of the present disclosure, a light emitting element includes: a light emitting structure including a first conductive type semiconductor layer, a second conductive type semiconductor layer, and an active layer interposed between the first conductive type semiconductor layer and the second conductive type semiconductor layer; a first contact electrode and a second contact electrode disposed under the light emitting structure and forming ohmic contact with the first and second conductive type semiconductor layers, respectively; an insulating layer insulating the first contact electrode and the second contact electrode from each other and partially covering the first and second contact electrodes; a first bulk electrode and a second bulk electrode disposed under the light emitting structure and the insulating layer and electrically connected to the first and second contact electrodes, respectively; an insulating supporter covering side surfaces of the first bulk electrode and the second bulk electrode while at least partially exposing lower surfaces of the first bulk electrode and the second bulk electrode; a first wavelength converter covering at least part of a side surface and an upper surface of the light emitting structure; a translucent layer disposed on the first wavelength converter; and a second wavelength converter disposed on the translucent layer, wherein the first wavelength converter and the second wavelength converter have a smaller thickness than the translucent layer and each of the first and second wavelength converters has a thickness of 20 μm to 200 μm.

In accordance with a further aspect of the present disclosure, a method of manufacturing a light emitting element includes: preparing a wafer by forming a light emitting structure on a growth substrate, the light emitting structure including a first conductive type semiconductor layer, a second conductive type semiconductor layer and an active layer interposed between the first conductive type semiconductor layer and the second conductive type semiconductor layer, the light emitting structure having a plurality of unit device regions; forming a first contact electrode and a second contact electrode to form ohmic contact with the first and second conductive type semiconductor layers in each of the unit device regions, respectively; forming an insulating layer insulating the first contact electrode and the second contact electrode from each other and partially covering the first and second contact electrodes; forming a first bulk electrode and a second bulk electrode on the insulating layer to be electrically connected to the first and second contact electrodes, respectively, and forming an insulating supporter covering side surfaces of the first bulk electrode and the second bulk electrode; forming at least one isolation trench between the unit device regions, the isolation trench being formed by removing at least part of the light emitting structure; forming a first wavelength converter under the light emitting structure while filling the isolation trench; forming a translucent layer under the first wavelength converter; and forming a second wavelength converter under the translucent layer, wherein white light emitted from the light emitting element has a CIEx value of 0.390 or more in the CIE standard chromaticity coordinates.

Forming the isolation trench may include partially removing the light emitting structure, the first contact electrode and the insulating layer, the insulating supporter may be exposed through the isolation trench, and the first wavelength converter may adjoin the insulating supporter exposed through the isolation trench.

One of the first contact electrode and the insulating layer may be exposed to an upper surface of the isolation trench, and the first wavelength converter may adjoin the first contact electrode or the insulating layer exposed to the upper surface of the isolation trench.

Forming the isolation trench may include removing the insulating supporter to separate the plurality of unit device regions from each other, and the first wavelength converter fills the isolation trench to cover a side surface of the insulating supporter.

The method may further include separating the growth substrate from the light emitting structure.

The method may further include forming an additional translucent layer disposed under the second wavelength converter.

According to exemplary embodiments of the present disclosure, the light emitting element includes first and second wavelength converters and a translucent layer interposed between the wavelength converters, thereby improving luminous efficacy while emitting white light having the same color temperature. Furthermore, exemplary embodiments of the present disclosure provide a method of manufacturing a light emitting element at a wafer level, which can easily manufacture light emitting elements while reducing deviation in optical characteristics between the light emitting elements manufactured thereby. Furthermore, exemplary embodiments of the present disclosure provide a small white light emitting element that includes an insulating supporter and bulk electrodes to improve mechanical stability and heat dissipation efficiency.

BRIEF DESCRIPTION OF THE DRAWINGS

FIG. 1 to FIG. 20A are plan views and cross-sectional views illustrating a light emitting element and a method of manufacturing the same according to one exemplary embodiment of the present disclosure.

DETAILED DESCRIPTION

Figure 1:
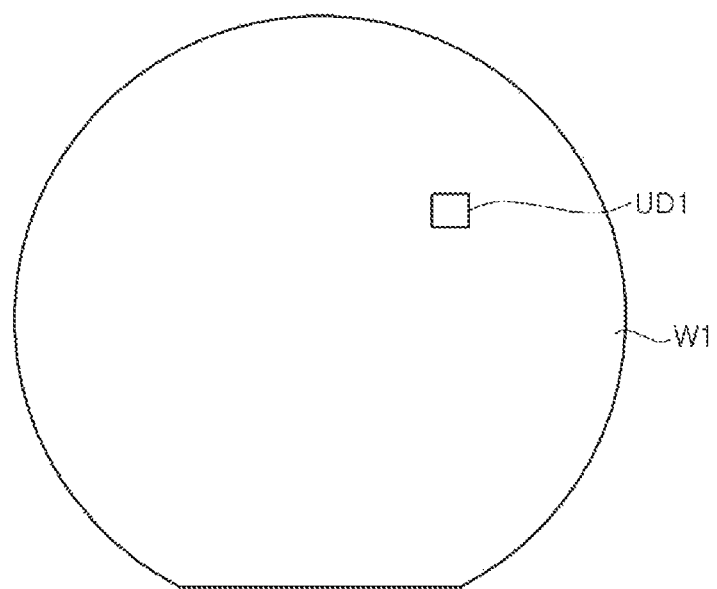

Hereinafter, exemplary embodiments of the present disclosure will be described in detail with reference to the accompanying drawings. The present disclosure is not limited to the embodiments disclosed herein and can also be implemented in different forms. When an element is referred to as being "disposed above" or "disposed on" another element, it can be directly "disposed above" or "disposed on" the other element, or intervening elements can be present. Throughout the specification, like reference numerals denote like elements having the same or similar functions.

FIG. 1 to FIG. 20A are plan views and cross-sectional views illustrating a light emitting element and a method of manufacturing the same according to one exemplary embodiment of the present disclosure. In these views, a cross-sectional view shown in (b) is taken along line A-A' of a plan view shown in (a). Although FIG. 1 to FIG. 20A will be referred to in description of a method of manufacturing the light emitting element according to the exemplary embodiment, the manufacturing method according to the exemplary embodiment is not restricted to sequences of FIG. 1 to FIG. 20A.

Figure 2:
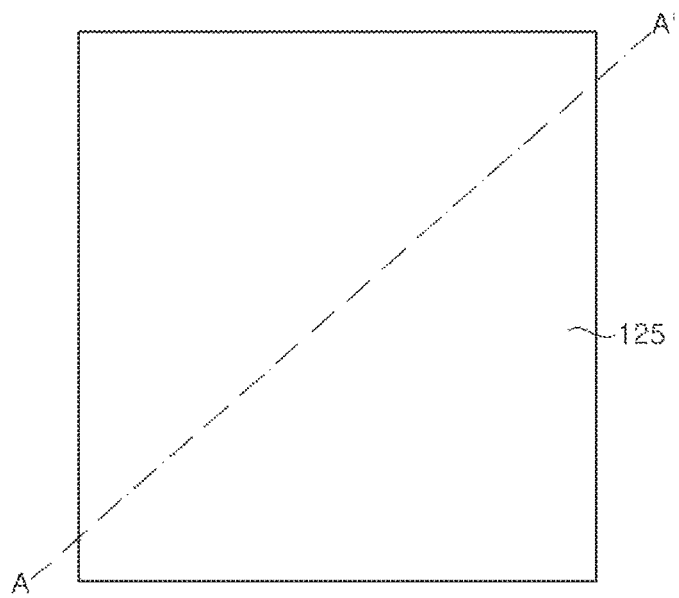
Figure 2:

First, referring to FIG. 1 and FIG. 2, a wafer W1 is prepared by forming a light emitting structure 120 on a growth substrate 110.

Referring to FIG. 1, the wafer W1 may include the growth substrate 110 and the light emitting structure 120 grown on the growth substrate 110. In addition, a plurality of light emitting elements may be manufactured from a single wafer W1. Thus, the wafer W1 may include a plurality of unit device regions UD1. For convenience, the method of manufacturing a light emitting element in one unit device region UD1 will be described in description with reference to FIG. 2 to FIG. 12. That is, the method according to this exemplary embodiment may be applied to the entirety of the wafer W1 including the plurality of unit device regions UD1.

Referring to FIG. 2, the light emitting structure 120 including a first conductive type semiconductor layer 121, an active layer 123 and a second conductive type semiconductor layer 125 is formed on the growth substrate 110.

The growth substrate 110 may be or include any substrate that allows growth of the light emitting structure 120 thereon. For example, the growth substrate 110 may be or include a sapphire substrate, a silicon carbide substrate, a silicon substrate, a gallium nitride substrate, an aluminum nitride substrate, or others. In this exemplary embodiment, the substrate 110 may include a roughness pattern on an upper surface thereof.

The light emitting structure 120 may be grown on the growth substrate 110 by metal organic chemical vapor deposition (MOCVD), hydride vapor phase epitaxy (HVPE), molecular beam epitaxy (MBE), or others. The light emitting structure 120 includes the first conductive type semiconductor layer 121, the active layer 123, and the second conductive type semiconductor layer 125. Each of the first conductive type semiconductor layer 121, the active layer 123 and the second conductive type semiconductor layer 125 may include III-V compound semiconductors, for example, nitride-based semiconductors such as (Al, Ga, In)N. The first conductive type semiconductor layer 121 includes n-type dopants (for example, Si) to exhibit n-type conductivity and the second conductive type semiconductor layer 125 includes p-type dopants (for example, Mg) to exhibit p-type conductivity, or vice versa. The active layer 123 may have a multi-quantum well (MQW) structure and the composition of the active layer may be determined so as to emit light having desired wavelengths. For example, the active layer 123 may be configured to emit light having a peak wavelength in the UV wavelength band or in the blue light wavelength band.

Figure 3:
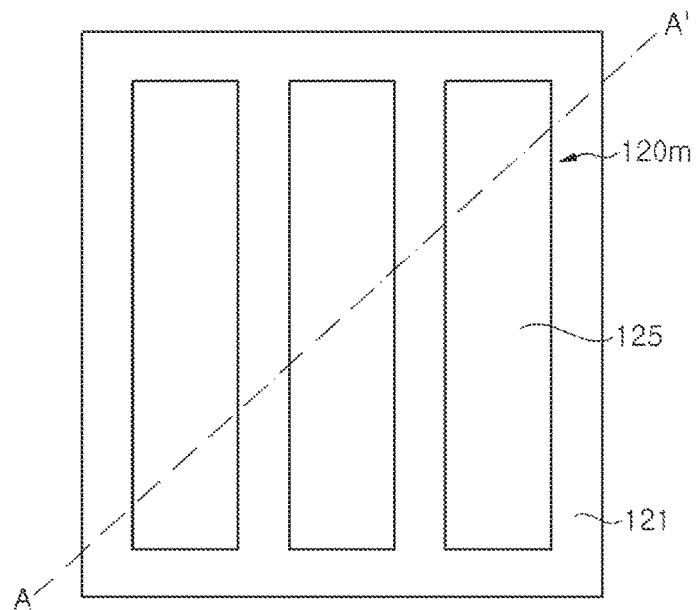
Figure 3:
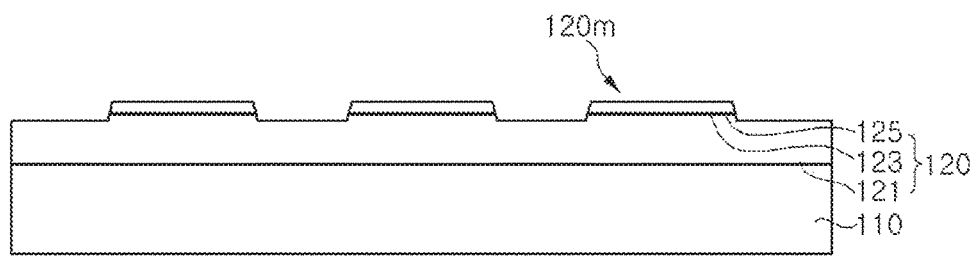

Referring to FIG. 3, a partially exposed region of the first conductive type semiconductor layer 121 is formed by patterning the light emitting structure 120. For example, at least one mesa 120m is formed to form a region in which the first conductive type semiconductor layer 121 is partially exposed, as shown in FIG. 3.

The mesa 120m may be formed by partially removing the second conductive type semiconductor layer 125 and the active layer 123 through suitable method such as photolithography or etching. The first conductive type semiconductor layer 121 may be partially exposed around the mesa 120m. For example, although the shape of the mesa 120m is not particularly limited, the mesa 120m may have an elongated shape extending substantially in the same direction, as shown in FIG. 3(a), and may include a plurality of mesas. Here, the plural mesas 120m are spaced apart from one another.

Figure 4:
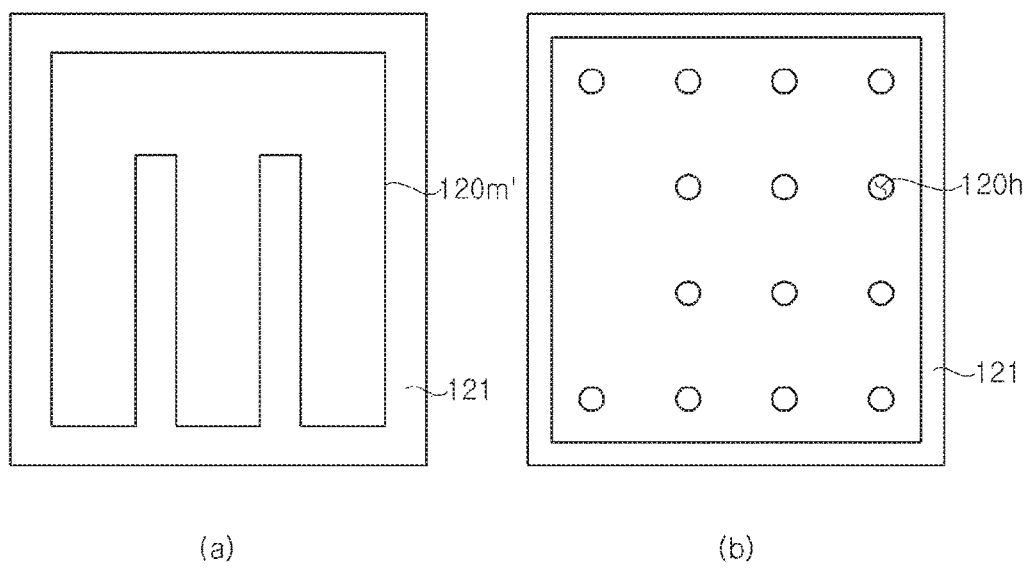

Alternatively, as shown in FIGS. 4 (a) and (b), the mesa 120m may have an integral structure and may have an indented portion at one side surface thereof. For example, as shown in FIG. 4(a), a mesa 120m' may have a structure in which one side of the mesa 120m' near one side of the growth substrate 110 includes a continuous region and the other side of the mesa 120m' opposite to the one side of the growth substrate 110 includes separated regions. The separated region may extend from the continuous region in a direction away from the continuous region. The first conductive type semiconductor layer 121 may be partially exposed through the separated regions. The mesa 120m' may include plural separated regions, for example, two regions as shown in FIG. 4(a), or at least three regions. Alternatively, as shown in FIG. 4(b), the light emitting structure 120 may include at least one hole 120h that partially exposes the first conductive type semiconductor layer 121. The light emitting structure 120 may include a plurality of holes 120h, which may be regularly arranged.

Figure 5:
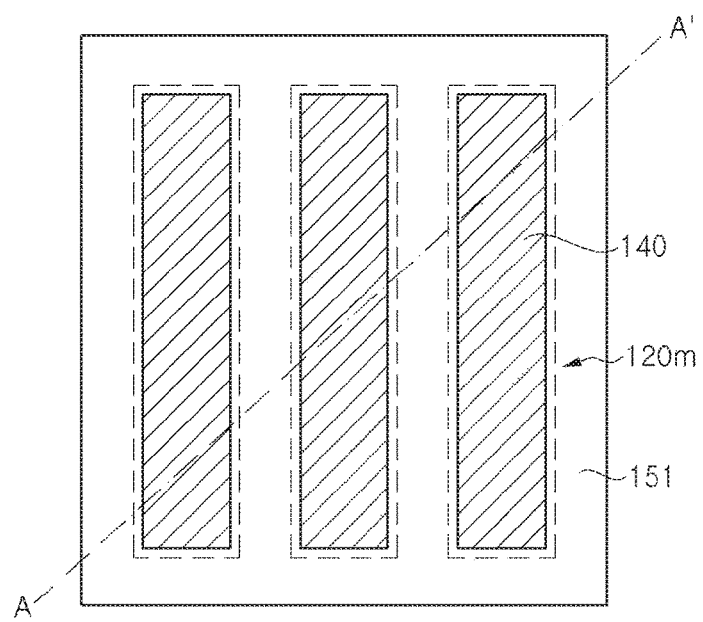
Figure 5:
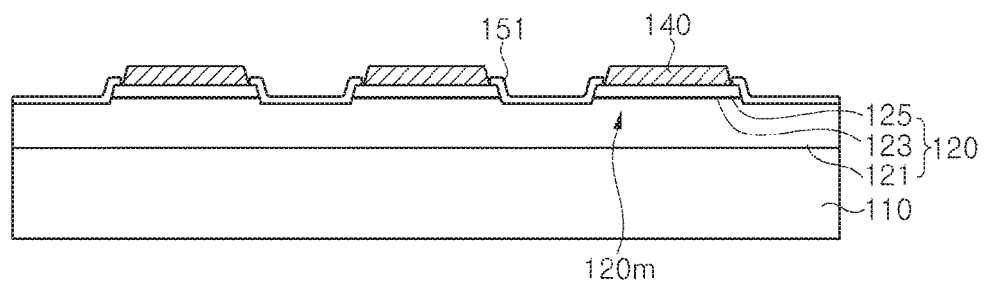

Next, referring to FIG. 5, a second contact electrode 140 is formed on the second conductive type semiconductor layer 125, that is, on at least part of an upper surface of the mesa 120m. In addition, a pre-first insulating layer 151 may be further formed on the light emitting structure 120.

The second contact electrode 140 may be formed of or include a material capable of forming ohmic contact with the second conductive type semiconductor layer 125, and may include, for example, a metallic material and/or a conductive oxide.

For the second contact electrode 140 including a metallic material, the second contact electrode 140 may include a reflective layer and a cover layer covering the reflective layer. As described above, the second contact electrode 140 serves to reflect light while forming ohmic contact with the second conductive type semiconductor layer 125. Accordingly, the reflective layer may include a metal that has high reflectivity and can form ohmic contact with the second conductive type semiconductor layer 125. For example, the reflective layer may include at least one of Ni, Pt, Pd, Rh, W, Ti, Al, Mg, Ag, or Au. In addition, the reflective layer may be composed of or include a single layer or multiple layers.

The cover layer can prevent inter-diffusion of materials between the reflective layer and other layers and can prevent external materials from diffusing into and damaging the reflective layer. Accordingly, the cover layer may be formed to cover a lower surface and a side surface of the reflective layer. The cover layer may be electrically connected to the second conductive type semiconductor layer 125 together with the reflective layer and act as an electrode together with the reflective layer. The cover layer may include, for example, Au, Ni, Ti, Cr, or others, and may be composed of or include a single layer or multiple layers.

The reflective layer and the cover layer may be formed by e-beam deposition, plating, or others.

The conductive oxide for the second contact electrode 140 may include ITO, ZnO, AZO, IZO, or others. The second contact electrode 140 formed of or including the conductive oxide can cover a wider area of an upper surface of the second conductive type semiconductor layer 125 than the second contact electrode 140 including a metal. That is, a separation distance from the periphery of the exposed region of the first conductive type semiconductor layer 121 to the second contact electrode 140 including the conductive oxide may be relatively short. In this case, the shortest distance from a contact portion between the second contact electrode 140 and the second conductive type semiconductor layer 125 to a contact portion between a first contact electrode 130 and the first conductive type semiconductor layer 121 becomes further reduced, thereby reducing forward voltage Vf of the light emitting element.

This feature can be caused by a difference between the structure wherein the second contact electrode 140 is formed of or includes the metallic material and the structure wherein the second contact electrode 140 is formed of or includes the conductive material. For example, since the metallic material is deposited or plated, the second contact electrode 140 is formed at a portion separated by a predetermined distance from the outer periphery of the second conductive type semiconductor layer 125 (from the outer periphery of the mesa 120m) by a process margin of a mask. After the conductive oxide layer is formed on the entire upper surface of the second conductive type semiconductor layer 125, the conductive oxide is removed by the same process as the etching process for exposing the first conductive type semiconductor layer 121. Accordingly, the conductive oxide layer can be formed closer to the outer periphery of the second conductive type semiconductor layer 125. Here, it should be understood that other implementations are possible.

When the second contact electrode 140 is composed of or includes a transparent electrode such as ITO or ZnO or includes a transparent electrode, the first insulating layer 150 may include a distributed Bragg reflector to reflect light emitted from the light emitting structure 120, thereby improving luminous efficacy. When the second contact electrode 140 includes ITO, the first insulating layer 150 includes SiO2, and the first contact electrode 130 includes Ag, an omnidirectional reflector including a stacked structure of ITO/SiO2/Ag may be formed. Furthermore, the second contact electrode 140 may include both a conductive oxide layer and a metal layer. In this structure, the second contact electrode 140 may include a conductive oxide layer forming ohmic contact with the second conductive type semiconductor layer 125 and a metal layer disposed on the conductive oxide. Here, the metal layer may be or include a reflective layer having light reflectivity.

The pre-first insulating layer 151 may be formed on the light emitting structure 120 so as to cover at least a part of the upper surface of the light emitting structure 120 excluding a region in which the second contact electrode 140 will be formed. The pre-first insulating layer 151 may cover a region in which the first conductive type semiconductor layer 121 is exposed, and may also cover side surfaces of the mesas 120m while partially covering upper surfaces of the mesa 120m. The pre-first insulating layer 151 may contact the second contact electrode 140 or may be spaced apart therefrom. In the structure wherein the pre-first insulating layer 151 is spaced apart from the second contact electrode 140, the second conductive type semiconductor layer 125 is partially exposed between the pre-first insulating layer 151 and the second contact electrode 140. The pre-first insulating layer 151 may include SiO2, SiNx, MgF2, or others. Furthermore, the pre-first insulating layer 151 may include a multilayer structure, and may include a distributed Bragg reflector in which material layers having different indices of refraction are alternately stacked one above another.

The pre-first insulating layer 151 may be formed before or after formation of the second contact electrode 140, or during formation of the second contact electrode 140. For example, in the structure wherein the second contact electrode 140 includes a conductive oxide layer and a reflective layer including a metal disposed on the conductive oxide layer, the conductive oxide layer may be formed on the second conductive type semiconductor layer 125 and the pre-first insulating layer 151 may be formed before formation of the reflective layer. Here, the conductive oxide layer may form ohmic contact with the second conductive type semiconductor layer 125 and the pre-first insulating layer 151 may have a thickness of about 1,000 Å. In other exemplary embodiments, the pre-first insulating layer 151 may be formed before formation of the second contact electrode 140. In this exemplary embodiment, the second contact electrode 140 may form ohmic contact with the second conductive type semiconductor layer 125 and may include a reflective layer formed of or including a metallic material. In these exemplary embodiments, the pre-first insulating layer 151 is formed before formation of the reflective layer including the metallic material, thereby preventing reduction in reflectivity and increase in resistance of the reflective layer due to interdiffusion of materials between the reflective layer and the light emitting structure 120. In addition, it is possible to prevent electric short caused by the metallic material remaining in other regions, in which the second contact electrode 140 is not formed, during formation of the reflective layer including the metallic material.

Figure 6:
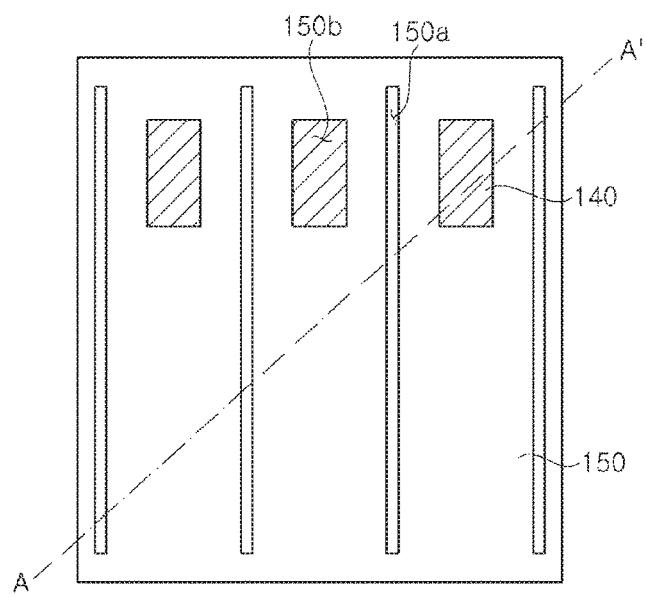
Figure 6:
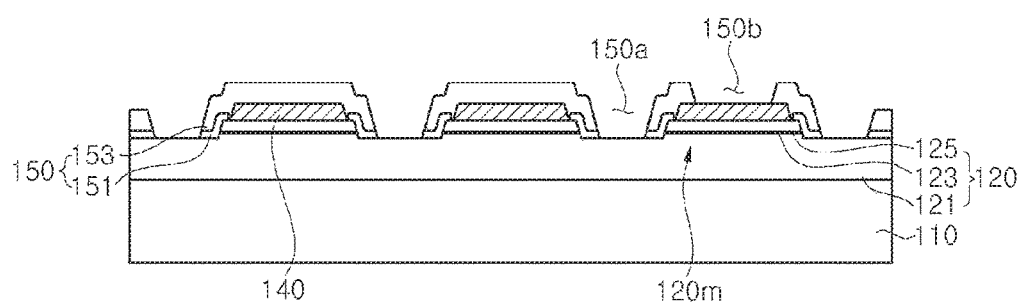

Next, referring to FIG. 6, the first insulating layer 150 is formed on the light emitting structure 120 so as to cover parts of the first conductive type semiconductor layer 121, the mesas 120m and the second contact electrode 140. In addition, the first insulating layer 150 may include first openings 150a partially exposing the first conductive type semiconductor layer 121 and second openings 150b partially exposing the second contact electrode 140.

The first insulating layer 150 may include the pre-first insulating layer 151 described in FIG. 5 and a main first insulating layer 153. The main first insulating layer 153 may include $SiO_2$, $SiN_x$, $MgF_2$, or others, and may be formed by any deposition process known in the art, such as PECVD, e-beam evaporation, or others. In some implementations, the first insulating layer 150 may be formed by forming the main first insulating layer 153 to cover the entirety of the first conductive type semiconductor layer 121, the mesas 120m and the second contact electrode 140, followed by forming the first and second openings 150a, 150b through a patterning process. For example, the patterning process may include a photolithography, etching or lift-off process. The main first insulating layer 153 may have a multilayer structure and may also include a distributed Bragg reflector in which material layers having different indices of refraction are alternately stacked one above another. The main first insulating layer 153 may have a greater thickness than the pre-first insulating layer 151.

The first insulating layer 150 may include at least one first opening 150a. For example, the first insulating layer 150 may include first openings 150a formed on the mesas 120m, respectively. In some implementations, the first openings 150a may be disposed near one side of the growth substrate 110. The second openings 150b may have an elongated shape extending in an extension direction of the mesas 120m. In some implementations, the second openings 150b may be formed near long sides of the mesas 120m. Here, it should be understood that the locations, sizes and number of the first and second openings 150a, 150b are not limited thereto and may be modified in various ways depending upon the locations of bulk electrodes 171, 173 described below.

Although a second contact electrode 140 is formed after formation of the mesa 120m in this exemplary embodiment, the second contact electrode 140 may be formed before formation of the mesa 120m in other exemplary embodiments.

Figure 7:
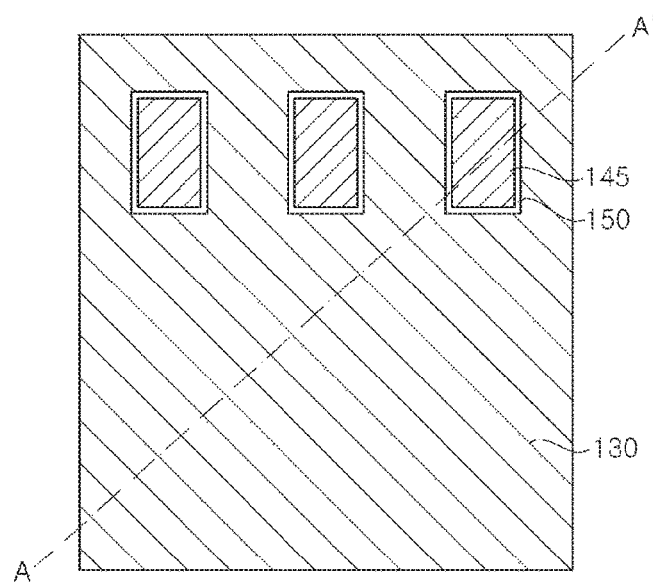
Figure 7:
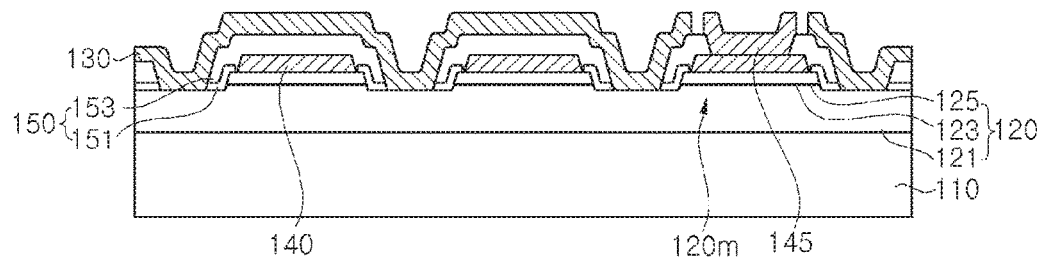

Next, referring to FIG. 7, the first contact electrode 130 is formed on the first insulating layer 150. The first contact electrode 130 may form ohmic contact with the first conductive type semiconductor layer 121 exposed through the first openings 150a. Further, a connection electrode 145 may be formed to electrically contact the second contact electrode 140 through the second openings 150b.

The first contact electrode 130 and the connection electrode 145 may be formed through any deposition and patterning processes known in the art, and may be formed at the same time or by different processes. The first contact electrode 130 and the connection electrodes 145 may be formed of or include the same material to have a multilayer structure. In some implementations, the first contact electrode 130 and the connection electrodes 145 may be formed of or include different materials and have a multilayer or single layer structure. The first contact electrode 130 is spaced apart from the connection electrode 145 and thus is electrically insulated from the second contact electrode 140.

As described above, the first contact electrode 130 may form ohmic contact with the first conductive type semiconductor layer 121 and may serve to reflect light. Accordingly, the first contact electrode 130 may include a highly reflective layer, such as an Al layer. Here, the first contact electrode 130 may be composed of or include a single layer or multiple layers. The highly reflective metal layer may be formed on a bonding layer such as a Ti, Cr or Ni layer. Alternatively, the first contact electrode 130 may include at least one of Ni, Pt, Pd, Rh, W, Ti, Al, Mg, Ag or Au. The connection electrode 145 may include at least one of, for example, Ni, Pt, Pd, Rh, W, Ti, Al, Mg, Ag, or Au.

For example, each of the first contact electrode 130 and/or the connection electrode 145 may include a multilayer structure. The multilayer structure may have a stacked structure including first bonding layer (ohmic contact layer)/reflective layer/barrier layer/anti-oxidation layer/second bonding layer. The first contact layer may contact the first conductive type semiconductor layer 121 and/or the second contact electrode 140 and may include Ni, Ti, Cr, or others. The reflective layer may include a metal having high reflectivity, for example, Al, Ag, or others. The barrier layer prevents interdiffusion of metals of the reflective layer, and may include a single layer including Cr, Co, Ni, Pt, or TiN, or multiple layers including Ti, Mo, and W. For example, the barrier layer may have a multilayer structure including Ti/Ni. The anti-oxidation layer prevents oxidation of other layers disposed under the anti-oxidation layer and may include a metallic material highly resistant to oxidation. The anti-oxidation layer may include, for example, Au, Pt, Ag, or others. The second bonding layer may be employed to enhance adhesion between a second insulating layer 160 and the first conductive type semiconductor layer 121 (or between the second insulating layer 160 and the connection electrode 145), and may include, for example, Ti, Ni, Cr, or others. However, it should be understood that other implementations are also possible.

Figure 8:
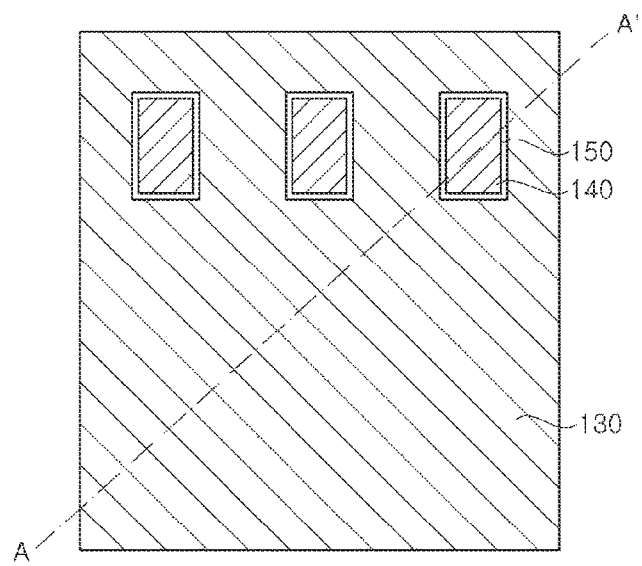
Figure 8:
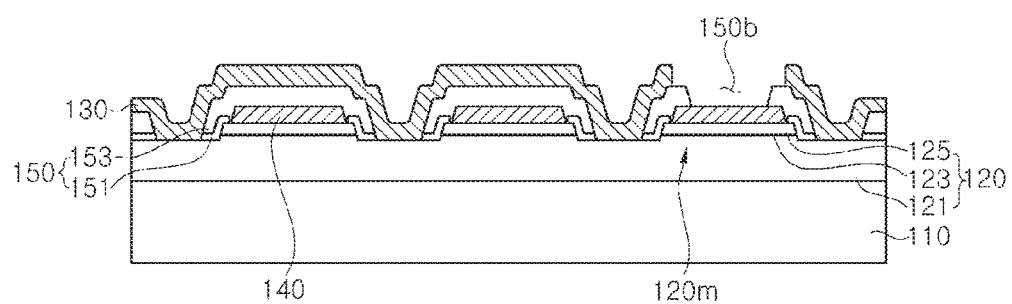

In some implementations, the connection electrode 145 may be omitted. Referring to FIG. 8, in exemplary embodiments wherein the connection electrode 145 is omitted, the second contact electrode 140 is exposed through the second openings 150b. Accordingly, a second bulk electrode 173 may directly contact the second contact electrode 140.

Figure 9:
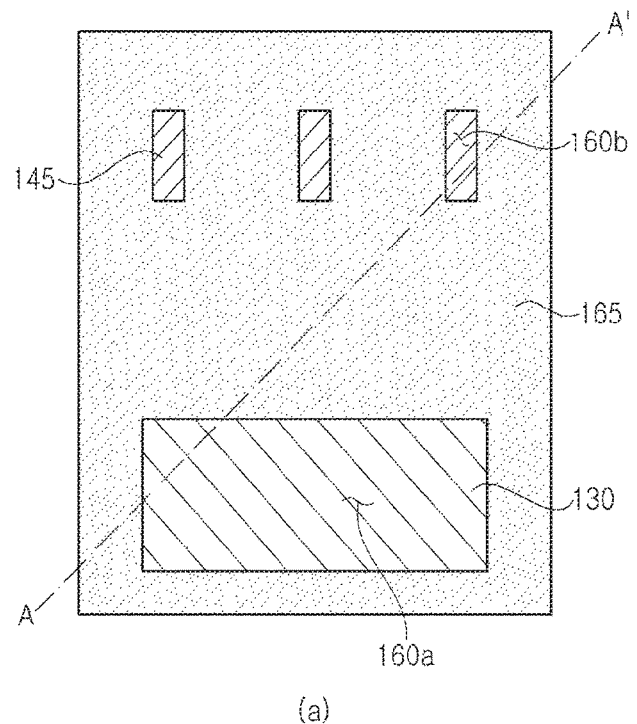
Figure 9:
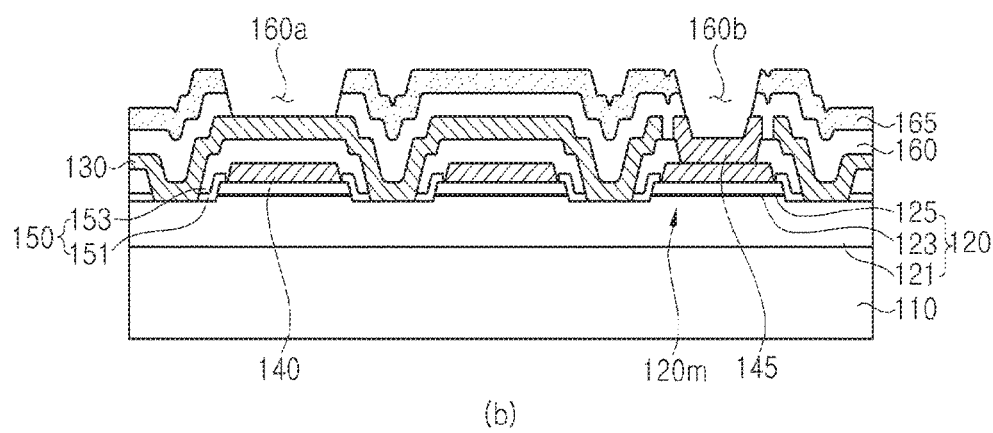

Next, referring to FIG. 9, a second insulating layer 160 is formed to cover parts of the first contact electrode 130 and the connection electrode 145. The second insulating layer 160 may include a third opening 160a and fourth openings 160b that expose the first contact electrode 130 and the connection electrode 145, respectively. In some implementations, a stress relieving layer 165 may be formed on the second insulating layer 160.

The second insulating layer 160 may include $SiO_2$, SiNx, MgF2, or others, and may be formed by any deposition process known in the art, such as PECVD, e-beam evaporation, or others. Here, the second insulating layer 160 may be formed to cover the entirety of the first contact electrode 130 and the connection electrode 145, followed by forming the third and fourth openings 160a, 160b through a patterning process. The patterning process may include a photolithography, etching or lift-off process. The second insulating layer 160 may include a multilayer structure and may include a distributed Bragg reflector in which material layers having different indices of refraction are alternately stacked one above another. The uppermost layer of the second insulating layer 160 may be formed of or include SiNx. With the structure wherein the uppermost layer of the second insulating layer 160 is formed of or include SiNx, the light emitting element can more effectively prevent moisture from entering the light emitting structure 120. In some implementations, the second insulating layer 160 may have a smaller thickness than the first insulating layer 150, for example, a thickness of about 0.8 µm in order to secure insulation resistance. However, it should be understood that other implementations are also possible.

The third and fourth openings 160a, 160b expose the first contact electrode 130 and the connection electrode 145, respectively, thereby providing a passage through which the bulk electrodes 171, 173 can be electrically connected to the first contact electrode 130 and the second contact electrode 140, respectively.

The stress relieving layer 165 may be formed by a process, such as deposition or spin coating, and may be subjected to patterning together with the second insulating layer 160. Accordingly, the stress relieving layer 165 may include openings formed at positions corresponding to the third and fourth openings 160a, 160b. Here, the stress relieving layer 165 may be omitted.

Figure 10:
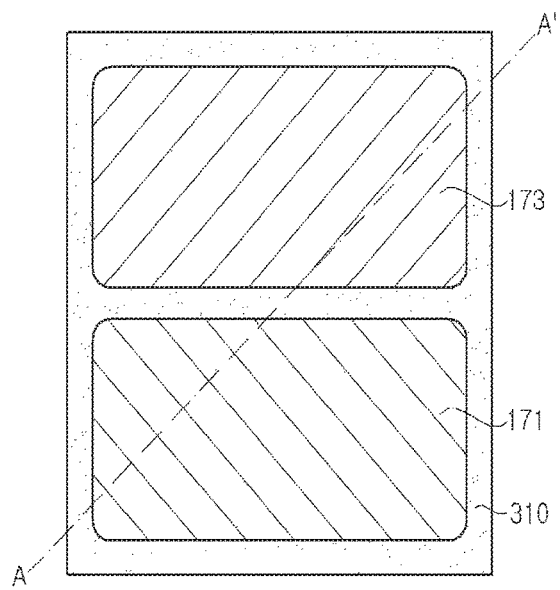
Figure 10:
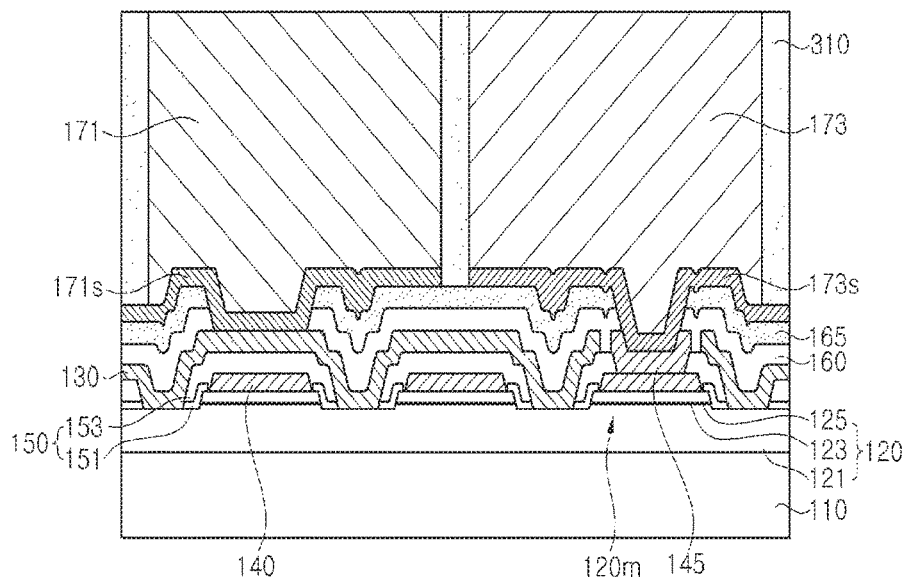
Figure 11:
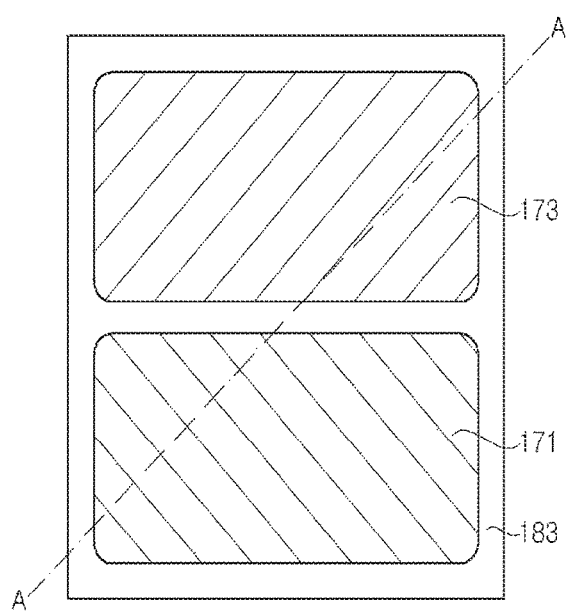
Figure 11:
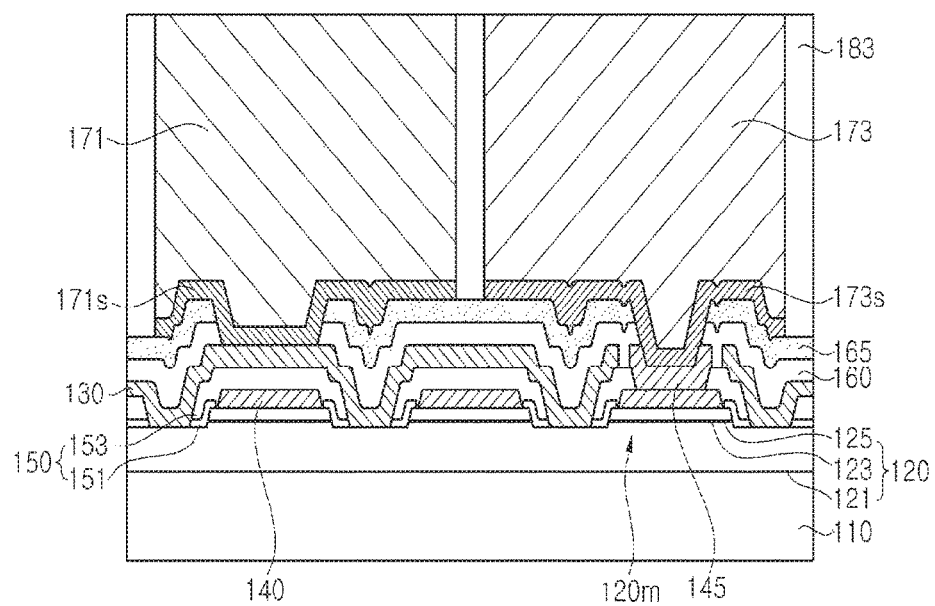

Referring to FIG. 10 and FIG. 11, a first bulk electrode 171, a second bulk electrode 173, and a lower insulating supporter 183 are formed on the second insulating layer 160.

Specifically, referring to FIG. 10, regions in which the first and second bulk electrodes 171, 173 will be formed is defined using a bulk electrode mold 310, followed by forming the first bulk electrode 171 and the second bulk electrode 173. The bulk electrode mold 310 may have a mold enabling patterning and may include, for example, a photosensitive polyimide, SU-8, a photoresist for plating, or a dry film.

The first and second bulk electrodes 171, 173 may be formed by plating, deposition, dotting, screen printing, or others. On the other hand, formation of the first and second bulk electrodes 171, 173 may include forming a first metal layer 171s and a second metal layer 173s. The first metal layer 171s and the second metal layer 173s may be disposed under the first and second bulk electrodes 171, 173, respectively, to adjoin the first contact electrode 130, the connection electrode 145, the insulating layers 150, 160, and the stress relieving layer 165. The first metal layer 171s and the second metal layer 173s may be changed depending upon a method of forming the bulk electrodes 171, 173.

Each of the first bulk electrode 171 and the second bulk electrode 173 may have a thickness of several dozen micrometers, for example, about 70 μm to 80 μm. Within this thickness range of the bulk electrodes 171, 173, the light emitting element can be used as a chip scale package. Each of the first and second bulk electrodes 171, 173 may be composed of or include a single layer or multiple layers and include an electrically conductive material. For example, the first bulk electrode 171 and the second bulk electrode 173 may include Cu, Pt, Au, Ti, Ni, Al, Ag, or others. Further, the first and second bulk electrodes 171, 173 may also include sintered metal particles and non-metallic materials interposed between the metal particles.

Next, referring to FIG. 11, the bulk electrode mold 310 is removed and the lower insulating supporter 183 is formed to cover at least part of side surfaces of the first and second bulk electrodes 171, 173. The lower insulating supporter 183 may be formed of or include, for example, a material, such as an epoxy molding compound (EMC) or a Si resin, through any process known in the art, such as screen printing or spin coating. In some implementations, the lower insulating supporter 183 may also include light reflective and light scattering particles, such as TiO2 particles. When the lower insulating supporter 183 includes EMC or is formed of EMC, the stress relieving layer 165 can prevent separation of the lower insulating supporter 183 while preventing moisture from entering the lower insulating supporter 183.

The method of manufacturing the light emitting element according to this exemplary embodiment may further include planarizing upper surfaces of the first bulk electrode 171, the second bulk electrode 173 and the lower insulating supporter 183 after formation of the lower insulating supporter 183. Accordingly, the upper surfaces of the first bulk electrode 171, the second bulk electrode 173, and the lower insulating supporter 183 may be substantially flush with one another. Planarization of the first bulk electrode 171, the second bulk electrode 173 and the lower insulating supporter 183 may include at least one of grinding, lapping, CMP, or wet etching.

Next, formation of the first bulk electrode 171, the second bulk electrode 173 and the lower insulating supporter 183 will be described in more detail. In a process of forming the first and second bulk electrodes 171, 173 by plating, the first and second metal layers 171s, 173s are formed on the overall upper surfaces of the stress relieving layer 165, the third opening 160a and the fourth opening 160b by sputtering and/or PVD. The first and second metal layers 171s, 173s may include Ti, Cu, Au, Cr, or others, and can act as under-bump metallization layers (UBM layers) or seed metals. For example, each of the first and second metal layers 171s, 173s may have a stacked structure of Ti/Cu. Next, a mask is formed on the first and second metal layers 171s, 173s. Here, the mask may be the bulk electrode mold 310. The bulk electrode mold 310 masks a portion corresponding to the region in which the lower insulating supporter 183 is formed and opens the region in which the first and second bulk electrodes 171, 173 are formed. Next, the first and second bulk electrodes 171, 173 are formed in the open region of the mask through plating, in which the first and second bulk electrodes 171, 173 can be formed using the first and second metal layers 171s, 173s as seed layers, respectively (see FIG. 10). The first and second bulk electrodes 171, 173 can be provided by removing the bulk electrode mold 310 and parts of the first and second bulk electrodes 171, 173 disposed under the bulk electrode mold 310 through etching. Thus, the first and second metal layers 171s, 173s may remain under the first and second bulk electrodes 171, 173. Thereafter, the lower insulating supporter 183 is formed to surround the side surfaces of the first and second bulk electrodes 171, 173 (see FIG. 11).

In some implementations, the first and second bulk electrodes 171, 173 may be formed by screen printing as follows. The UBM layers are formed on at least parts of the stress relieving layer 165, the third opening 160a, and the fourth opening 160b through deposition such as sputtering and patterning, or deposition and a lift-off process. The UBM layers may be formed on the regions in which the first and second bulk electrodes 171, 173 will be formed, and may include a (Ti or TiW) layer and a (Cu, Ni, Au single layer or a combination) layer. For example, the UBM layers may have a stacked structure including Ti/Cu. The UBM layers may correspond to the first and second metal layers 171s, 173s. Next, a mask is formed thereon. Here, the mask masks a portion corresponding to the region in which the lower insulating supporter 183 is formed, and opens the region in which the first and second bulk electrodes 171, 173 are formed. Next, a material, such as Ag pastes, Au pastes, Cu pastes, or others, is formed in the open region through screen printing and is then cured (see FIG. 10). The first and second bulk electrodes 171, 173 can be provided by removing the mask through etching. Next, the lower insulating supporter 183 surrounding the side surfaces of the first and second bulk electrodes 171, 173 is formed (see FIG. 11).

Figure 12:
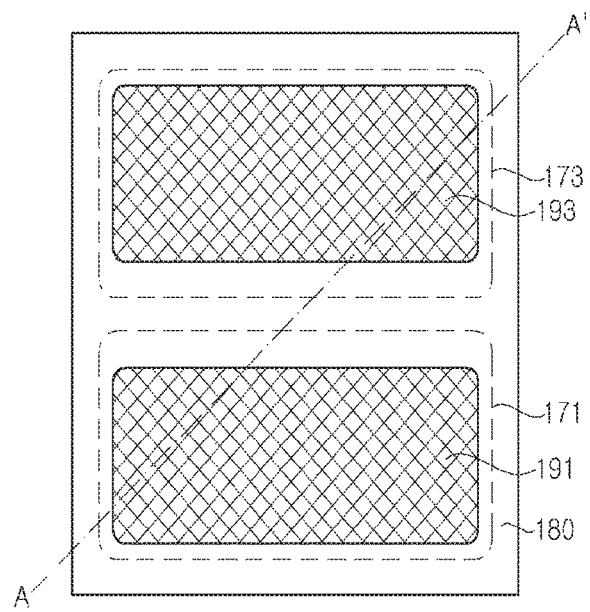
Figure 12:
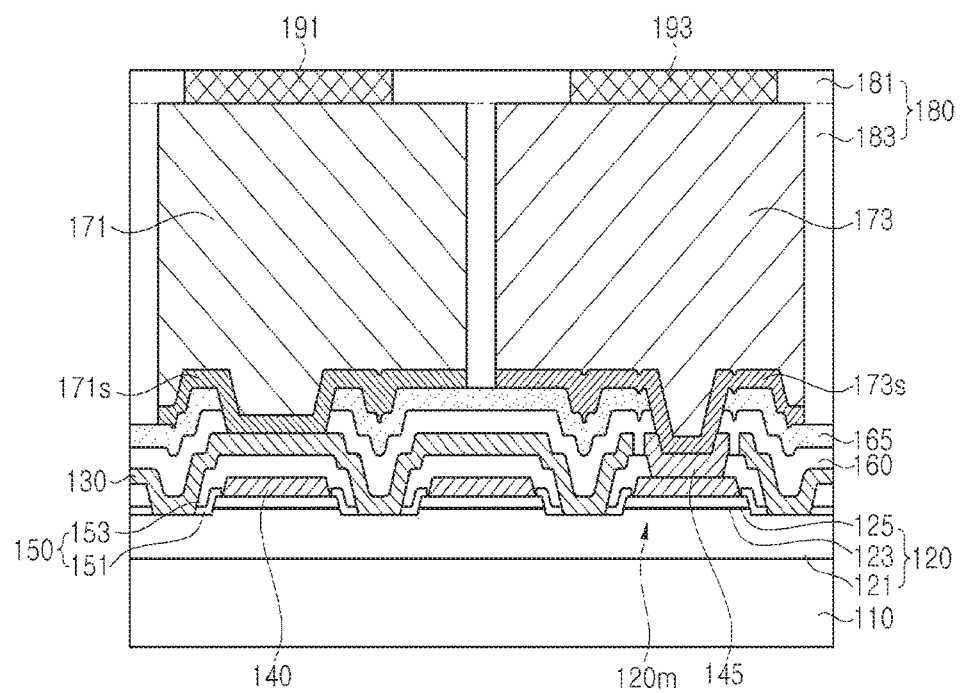

Next, referring to FIG. 12, a first pad electrode 191, a second pad electrode 193, and an upper insulating supporter 181 may be further formed on the lower insulating supporter 183 and the bulk electrodes 171, 173.

The first and second pad electrodes 191, 193 may be formed on the first and second bulk electrodes 171, 173, respectively, through deposition and patterning. The upper insulating supporter 181 may surround the side surfaces of the first and second pad electrodes 191, 193. By forming the upper insulating supporter 181, an insulating supporter 180 including the upper insulating supporter 181 and the lower insulating supporter 183 can be provided. The upper insulating supporter 181 may be formed of or include the same material as the lower insulating supporter 183, or may be formed of or include a different material from the lower insulating supporter 183.

The upper surfaces of the first and second bulk electrodes 171, 173 may be partially covered by the upper insulating supporter 181 such that the exposed upper surfaces of the first and second bulk electrodes 171, 173 have smaller horizontal cross-sectional areas than the first and second bulk electrodes 171, 173, respectively. In some implementations, the upper insulating supporter 181 may be disposed on the upper surfaces of the first and second bulk electrodes 171, 173 around the side surfaces of the first and second bulk electrodes 171, 173, which face each other. Thus, a separation distance between the upper surface of the first bulk electrode 171 exposed by openings of the upper insulating supporter 181 and the exposed upper surface of the second bulk electrode 173 is greater than a separation distance between the first bulk electrode 171 and the second bulk electrode 173.

The light emitting element according to this exemplary embodiment may be disposed on a separate substrate using a conductive material (for example, solders, conductive adhesives, eutectic materials, or others). In order to prevent electric short caused by the conductive material used to mount the light emitting element, the distance between the electrodes exposed to the mounting surface of the light emitting element needs to be a predetermined value or more. According to the exemplary embodiments, the insulating supporter 180 is formed to partially cover the upper surfaces of the bulk electrodes 171, 173, whereby the distance between the exposed upper surface of the first bulk electrode 171 and the exposed upper surface of the second bulk electrode 173 can become greater than the distance between the first bulk electrode 171 and the second bulk electrode 173. Therefore, the distance between the electrodes exposed to the mounting surface may be set to be greater than or equal to a predetermined value capable of preventing electric short, and the distance between the bulk electrodes 171, 173 may be set to be smaller than or equal to a predetermined value capable of preventing electric short by the conductive material for mounting. Thus, heat dissipation efficiency of the light emitting element can be improved by increasing the horizontal cross-sectional area of the bulk electrodes 171, 173 by reducing the distance between the bulk electrodes 171, 173. At the same time, the distance between the first pad electrode 191 and the second pad electrode 193 is set to be greater than the distance between the bulk electrodes 171, 173, thereby effectively preventing electrical short during the process of mounting the light emitting element.

The distance between the first pad electrode 191 and the second pad electrode 193 may be about 150 μm or more, for example, when the light emitting element is mounted on a separate substrate through soldering. As another example, when the light emitting element is mounted on a separate substrate through eutectic bonding, the separation distance may be about 80 μm or more. Here, it should be understood that other implementations are also possible.

The upper insulating supporter 181 may have any arrangement so long as the upper insulating supporter 181 can be disposed on the upper surfaces of the bulk electrodes 171, 173 around the side surfaces of the bulk electrodes 171, 173, which face each other, such that the distance between the exposed upper surfaces of the first and second bulk electrodes 171, 173 becomes a predetermined value or more. For example, as shown in FIG. 4 and FIG. 5, a portion of the insulating supporter 180 interposed between the first and second bulk electrodes 171, 173 may have a T-shaped cross-section and a portion of the insulating supporter 180 covering outer side surfaces of the first and second bulk electrodes 171, 173 may have an inverted L-shaped cross-section.

According to the exemplary embodiments, the insulating supporter 180, particularly, the upper insulating supporter 181, may be formed to partially cover the upper surfaces of the first and second bulk electrodes 171, 173 and the side surfaces of the first and second pad electrodes 191, 193, thereby improving mechanical stability between the insulating supporter 180 and the bulk electrodes 171, 173. Accordingly, the light emitting element can have improved reliability. In addition, with improvement of mechanical stability of the light emitting element, it is possible to prevent damage to the light emitting structure 120 during separation of the growth substrate 110 from the light emitting structure 120.

Furthermore, the lower insulating supporter 183 and the upper insulating supporter 181 may be formed of or include the same material or different materials. When the lower insulating supporter 183 and the upper insulating supporter 181 are formed of or include the same material, the insulating supporter 180 may be formed of or include, for example, an epoxy molding compound (EMC) or a Si resin. When the lower insulating supporter 183 and the upper insulating supporter 181 are formed of or include different materials, the upper insulating supporter 181 may be formed of or include a material having lower brittleness and/or lower moisture absorptivity than the lower insulating supporter 183. For example, the lower insulating supporter 183 may include a material such as an epoxy molding compound (EMC) or a Si resin, and the upper insulating supporter 181 may include a material such as a photoresist (PR) and/or a photo-solder resist (PSR).

As the upper insulating supporter 181 is formed of or includes a material having relatively low brittleness, the upper insulating supporter 181 has a lower probability of breakage or cracking than the lower insulating supporter 183, thereby preventing infiltration of external contaminants through interfaces between the lower insulating supporter 183 and the bulk electrodes 171, 173. In addition, as the upper insulating supporter 181 is formed of or includes a material having relatively low moisture absorptivity, it is possible to prevent infiltration of external contaminants through the interfaces between the lower insulating supporter 183 and the bulk electrodes 171, 173. For example, when the lower insulating supporter 183 is formed of or includes a material having high moisture absorptivity such as EMC, the light emitting element can be more effectively protected from moisture by the upper insulating supporter 181 formed of or including a material such as PSR. When the upper insulating supporter 181 is formed to cover the interfaces between the lower insulating supporter 183 and the bulk electrodes 171, 173, the aforementioned function of protecting the light emitting element can be more effectively exerted.

In addition, as shown in the drawings, the upper surfaces of the first pad electrode 191 and the second pad electrode 193 may be substantially flush with the upper surface of the insulating supporter 180. With this structure, the upper surface of the light emitting element becomes substantially flat. In addition, the upper surface of the first pad electrode 191 may have substantially the same area as the upper surface of the second pad electrode 193. Therefore, electrical connection portions exposed to the mounting surface of the light emitting element can be formed in the same area, thereby facilitating the mounting process.

The first and second pad electrodes 191, 193 may be formed so as to fill the openings of the insulating supporter 180 by plating or others. Thereafter, the first and second pad electrodes 191, 193 and the insulating supporter 180 are partially removed by physical and/or chemical processes, for example, lapping or CMP, such that the upper surfaces of the first and second pad electrodes 191, 193 may be flush with the upper surface of the insulating supporter 180. The first pad electrode 191 and the second pad electrode 193 may include a conductive material, particularly, a metallic material, such as Ni, Pt, Pd, Rh, W, Ti, Al, Au, Sn, Cu, Ag, Bi, In, Zn, Sb, Mg, Pb, or others. The first and second pad electrodes 191, 193 may include substantially the same material as the bulk electrodes 171, 173, or may be formed of or include different materials. The first and second pad electrodes 191, 193 may be formed by deposition or plating, for example, electroless plating.

Next, the method of manufacturing the light emitting element according to this exemplary embodiment will be described with reference to FIG. 13 to FIG. 19, in which a plurality of unit device regions UD1 is formed. For example, in FIG. 13 to FIG. 19, three unit device regions UD1 are shown and correspond to part of a wafer W1. In addition, for clarity of illustration, reference numerals for the first contact electrode 130, the second contact electrode 140, the first insulating layer 150, the second insulating layer 160, the stress relieving layer 165 and the connection electrode 145 are omitted in FIG. 13 to FIG. 19.

Figure 13:
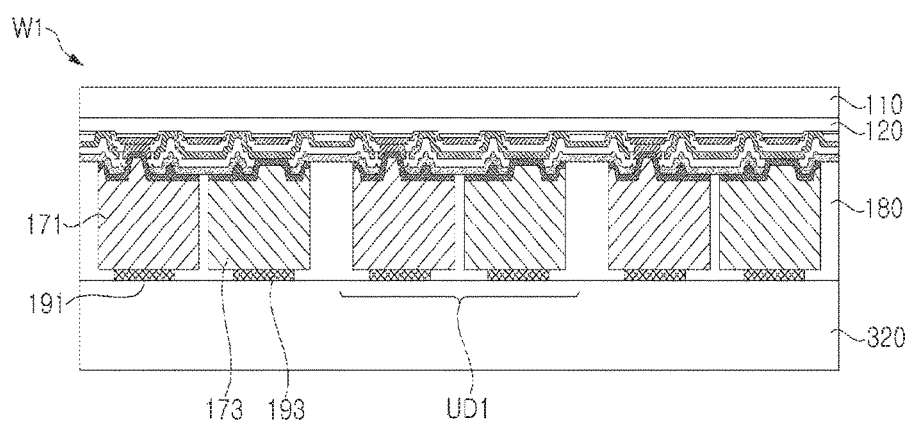
Figure 14:
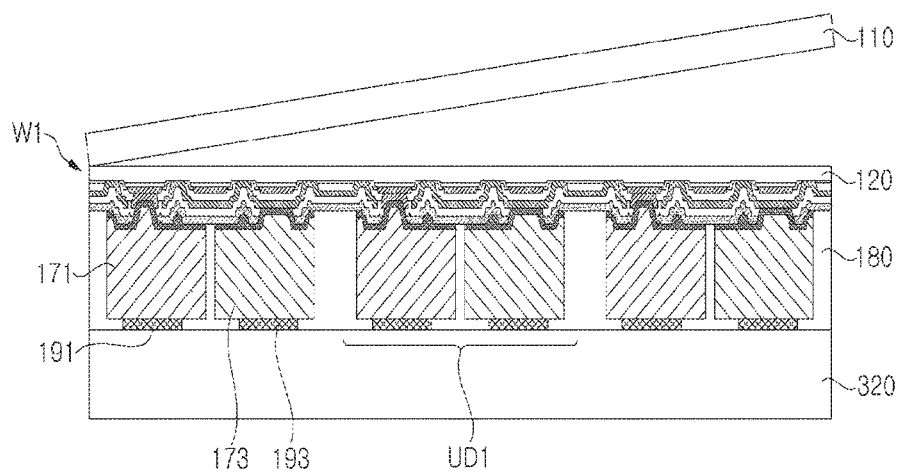

Next, referring to FIG. 13 and FIG. 14, the growth substrate 110 may be separated from the light emitting structure 120. Here, the wafer W1 may be temporarily bonded to a temporary substrate 320 before separation of the growth substrate 110.

First, referring to FIG. 13, the wafer W1 may be placed on the temporary substrate 320 before separation of the growth substrate 110. The temporary substrate 320 supports components disposed under the growth substrate 110, that is, the light emitting structure 120, the bulk electrodes 171, 173, and the insulating supporter 180, during separation of the growth substrate 110. Accordingly, it is possible to suppress occurrence of defects in the light emitting element due to stress and strain during separation of the growth substrate 110. In particular, when a growth substrate 110 is separated in a large area of wafer unit to fabricate a plurality of light emitting elements, cracking or breakage can occur in the light emitting structure 120 during separation of the growth substrate 110, thereby causing failure of the light emitting elements. The temporary substrate 320 can prevent occurrence of defects in the light emitting elements in this case.

Next, referring to FIG. 14, the growth substrate 110 may be separated from the light emitting structure 120. The growth substrate 110 may be removed from the first conductive type semiconductor layer 121 by at least one of laser lift-off, chemical lift-off, thermal lift-off, and stress lift-off. After separation of the growth substrate 110, the exposed surface of the first conductive type semiconductor layer 121 may be partially removed through at least one of dry etching, wet etching, a physical process, a chemical process, and a physicochemical process.

Alternatively, the process of separating the growth substrate 110 may be omitted. Thus, a subsequent process may be carried out, with the growth substrate 110 remaining on the light emitting structure 120.

Figure 15:
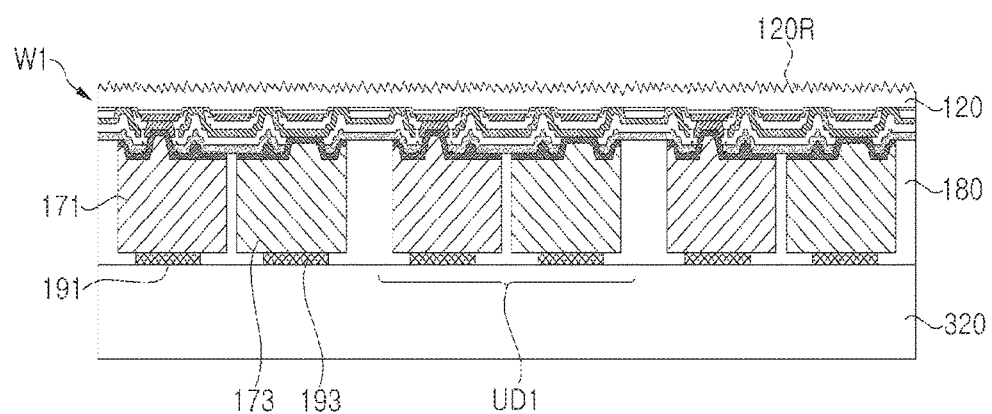

Next, referring to FIG. 15, roughness of the surface of the first conductive type semiconductor layer 121 exposed by separation of the growth substrate 110 may be increased. Accordingly, a roughened surface 120R may be formed on the surface of the light emitting structure 120, that is, on the surface of the first conductive type semiconductor layer 121. The roughened surface 120R may be formed by at least one of wet etching, dry etching, and electrochemical etching. For example, the roughened surface 120R may be formed by PEC etching or an etching process using an etching solution containing KOH and NaOH. Accordingly, the light emitting structure 120 may include protrusions and/or depressions of a micrometer to nanometer scale formed on the surface of the first conductive type semiconductor layer 121. The roughened surface 120R can improve light extraction efficiency with respect to light emitted from the light emitting structure 120.

Figure 16:
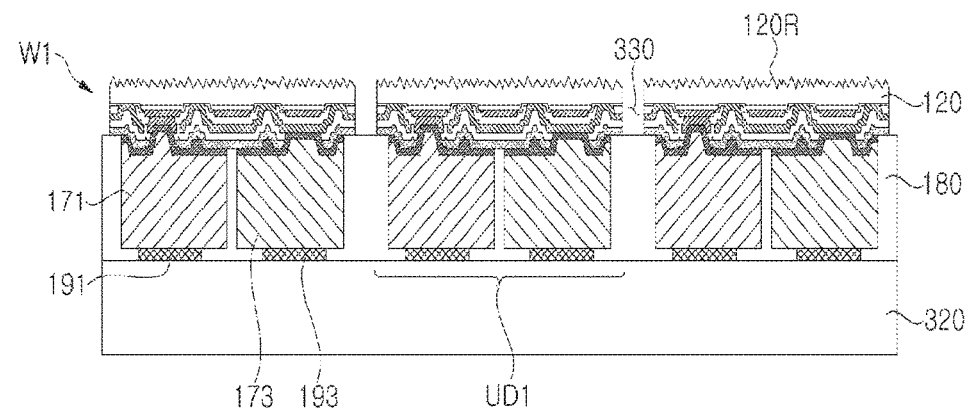

Next, referring to FIG. 16, at least one isolation trench 330 may be formed between the plural unit device regions UD1.

The isolation trench 330 may be formed by at least one of wet etching and dry etching. Forming the isolation trench 330 may include removing at least part of the light emitting structure 120 and may further include removing at least one of the first insulating layer 150, the second insulating layer 160, and the first contact electrode 130. In addition, in the structure wherein the stress relieving layer 165 is further formed, the stress relieving layer 165 may also be removed. As a result, the insulating supporter 180 can be partially exposed through the isolation trench 330.

However, it should be understood that other implementations are also possible, and an etching depth for formation of the isolation trench 330 may be arbitrarily adjusted. For example, a portion of the light emitting structure 120 may remain and be exposed to the bottom of the isolation trench 330, and one of the first insulating layer 150, the second insulating layer 160, the first contact electrode 130 and the stress relieving layer 165 may be exposed to the bottom of the isolation trench 330. In this case, the insulating supporter 180 is not exposed to the isolation trench 330.

Figure 17:
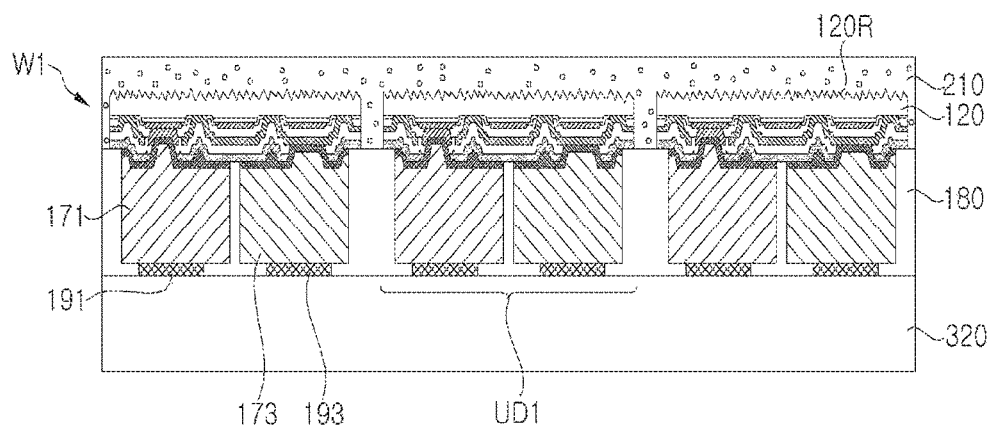

Next, referring to FIG. 17, a first wavelength converter 210 is formed on the light emitting structure 120. Here, the first wavelength converter 210 fills the isolation trench 330 to cover at least part of the side surfaces of the light emitting structure 120 of each unit device region UD1.

The first wavelength converter 210 may include a material capable of converting wavelengths of light. For example, the first wavelength converter 210 may include a carrier and phosphors or quantum-dot phosphors dispersed in the carrier. The phosphors can convert the wavelength of light emitted from the light emitting structure 120. For example, blue light emitted from the light emitting structure 120 is converted into light having a longer wavelength than the blue light by the first wavelength converter 210, whereby the blue light can be mixed with the light subjected to wavelength conversion by the first wavelength converter 210, thereby allowing white light to be emitted from the light emitting element. The phosphors may include typical phosphors known in the art, for example, nitride-based phosphors, silicate-based phosphors and fluoride-based phosphors. In addition, the first wavelength converter 210 may include green phosphors, cyan phosphors, red phosphors, yellow phosphors, or others.

The first wavelength converter 210 may be formed by a process such as deposition, spraying, coating, and curing. For example, the first wavelength converter 210 may be formed by coating a phosphor-containing material on the overall upper surface of the wafer W1 through spin coating, screen printing, doctor blade printing, or others, followed by curing. By such a deposition process, the first wavelength converter 210 can be formed to a substantially uniform thickness on the light emitting structure 120 while filling the isolation trench 330. As a result, the first wavelength converter 210 formed by conformal coating can be provided. On the other hand, in each of the unit device regions UD1, the thickness of the first wavelength converter 210 disposed on the side surfaces of the light emitting structure 120 may be determined depending upon the width of the isolation trench 330. In a subsequent process of dividing the plural unit device regions UD1 into individual light emitting elements, a portion of the first wavelength converter 210 filling the isolation trench 330 is cut in the vertical direction, whereby the thickness of the side surface of the first wavelength converter 210 can be determined. Thus, the thickness of the first wavelength converter 210 disposed on the upper surface of the light emitting structure 120 and the thickness of the first wavelength converter 210 disposed on the side surfaces of the light emitting structure 120 can become substantially constant by adjusting the width of the isolation trench 330.

Although the thickness of the first wavelength converter 210 is not limited to a particular value, the first wavelength converter 210 may be formed to a thickness that can minimize deterioration in luminous efficacy due to absorption of light emitted from the light emitting structure 120 while maintaining a predetermined degree or more of wavelength conversion efficiency. For example, the first wavelength converter 210 may have a thickness of about 20 μm to 200 μm. With this thickness range of the first wavelength converter 210, it is possible to prevent deterioration in luminous efficacy due to absorption of light by the first wavelength converter 210 while preventing light having passed through the first wavelength converter 210 from being converted into light having numerical values deviating from a target wavelength band, color temperature, or others.

Figure 18:
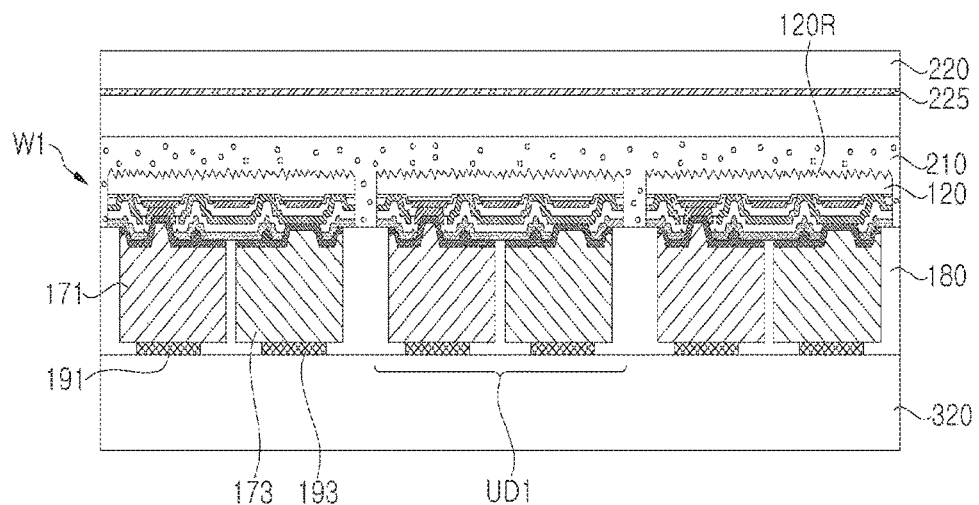

Next, referring to FIG. 18, a translucent layer 220 is formed on the first wavelength converter 210. Forming the translucent layer 220 may include forming a wavelength filter 225 disposed within the translucent layer 220.

The translucent layer 220 may be formed of or include a light transmitting material, and may include silicon, a silicon compound, a translucent polymer, or a translucent ceramic. The translucent layer 220 may be formed on the first wavelength converter 210 through coating and curing, or may be formed on the first wavelength converter 210 through deposition. Alternatively, the translucent layer 220 may be formed by a separate process and then bonded to the first wavelength converter 210. Although the thickness of the translucent layer 220 is not particularly limited, the translucent layer 220 may have a larger thickness than the first wavelength converter 210, for example, a thickness of about 100 μm to 500 μm. A second wavelength converter 230 formed by a subsequent process is spaced apart from the first wavelength converter 210 by the translucent layer 220. Since such a translucent layer 220 has a larger thickness than the first wavelength converter 210, the translucent layer 220 provides a sufficient passage through which light emitted from the first wavelength converter 210 reaches the second wavelength converter 230, thereby preventing deterioration in luminous efficacy due to interference between the first wavelength converter 210 and the second wavelength converter 230.

The wavelength filter 225 can perform a selective light transmission function and a selective light blocking function depending on the wavelength of light, and can also perform a selective light reflection function. For example, the wavelength filter 225 may include a distributed Bragg reflector in which dielectric layers having different indices of refraction are alternately stacked one above another, and may include, for example, a stacked structure of SiO2/TiO2 layers, in which SiO2/TiO2 layers are repeatedly stacked one above another. Here, the thickness of each of the SiO2 layer and the TiO2 layer can be controlled in consideration of the wavelength of light emitted from the light emitting structure 120 and the wavelength of light subjected to wavelength conversion by the first and second wavelength converters 210, 230. For example, reflectivity of the wavelength filter 225 can be adjusted depending upon the wavelength of light so as to transmit light emitted from the light emitting structure 120 and the first wavelength converter 210, while reflecting at least a fraction of light emitted from the second wavelength converter 230. Alternatively, the wavelength filter 225 may include a variety of filters known in the art.

The wavelength filter 225 may be disposed within the translucent layer 220, as shown in FIG. 18. Alternatively, the wavelength filter 225 may be disposed at the uppermost or lowermost side of the translucent layer 220. In addition, the translucent layer 220 may include a plurality of wavelength filters 225, which may be arranged to be spaced apart from each other or to contact each other.

Figure 19:
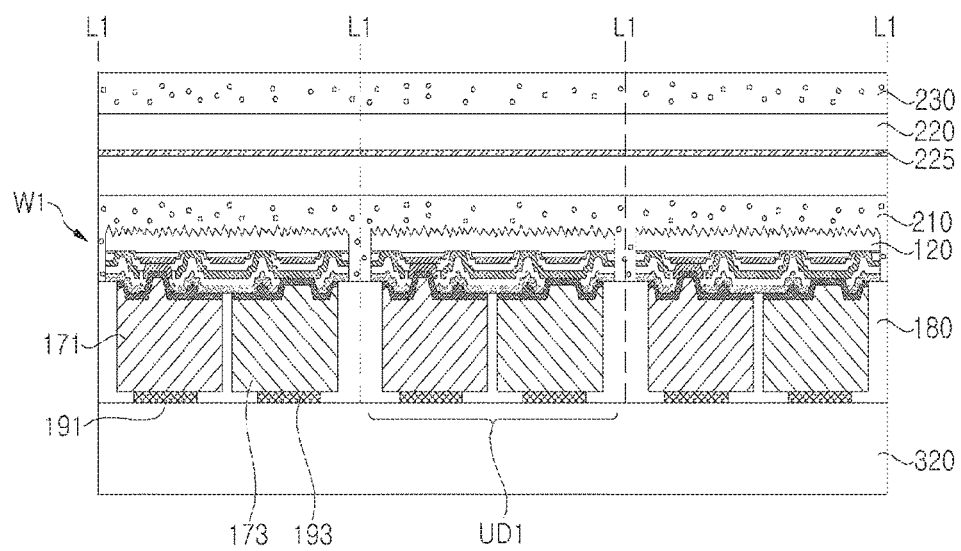
Figure 20A:
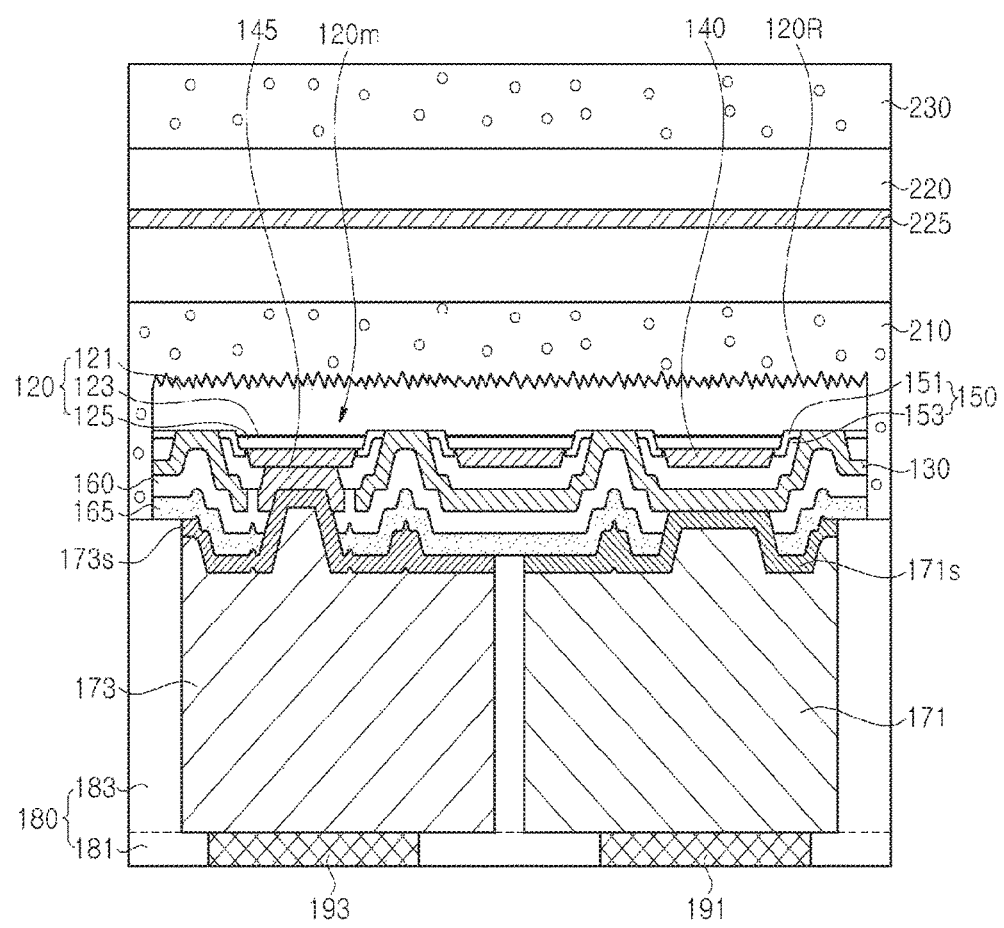

Next, referring to FIG. 19, the second wavelength converter 230 is formed on the translucent layer 220, and the wafer W1, the first wavelength converter 210, the translucent layer 220 and the second wavelength converter 230 are divided into a plurality of individual light emitting elements along device dicing lines L1, thereby providing light emitting elements as shown in FIG. 20A.

Like the first wavelength converter 210, the second wavelength converter 230 may include a material capable of converting wavelengths of light. For example, the second wavelength converter 230 may include a carrier and phosphors or quantum-dot phosphors dispersed in the carrier. The phosphors can convert the wavelength of light emitted from the light emitting structure 120 and/or the first wavelength converter 210. Accordingly, blue light emitted from the light emitting structure 120 is mixed with light subjected to wavelength conversion by the first wavelength converter 210 and the second wavelength converter 220, whereby white light can be emitted from the light emitting element.

Light subjected to wavelength conversion by the second wavelength converter 230 may have a shorter wavelength than light subjected to wavelength conversion by the first wavelength converter 210. Accordingly, the light subjected to wavelength conversion by the first wavelength converter 210 may be subjected to wavelength conversion again by the second wavelength converter 220 to prevent deterioration in luminous efficacy and to prevent target color coordinates of white light emitted from the light emitting element from being changed. Alternatively, the light subjected to wavelength conversion by the first wavelength converter 210 may have a shorter wavelength than the light subjected to wavelength conversion by the second wavelength converter 230. For example, the first wavelength converter 210 may include a green phosphor or a cyan phosphor and may further include at least one of yellow phosphors and red phosphors, and the second wavelength converter 230 may include at least one of yellow phosphors and red phosphors. With this configuration of the first and second wavelength converters 210, 230, it is possible to realize white light having a high color rendering index (CRI) through increase in emission intensity in the long wavelength band.

The phosphors may include typical phosphors known in the art, for example, nitride-based phosphors, silicate-based phosphors and fluoride-based phosphors. In addition, the second wavelength converter 230 may include green phosphors, cyan phosphors, red phosphors, yellow phosphors, or others.

The second wavelength converter 230 may be formed by a process such as deposition, spraying, coating, and curing. For example, the second wavelength converter 230 may be formed by coating a phosphor-containing material on the overall upper surface of the translucent layer 220 through spin coating, screen printing, doctor blade printing, or others, followed by curing. As a result, the second wavelength converter 230 can be provided in the form of a remote phosphor spaced apart from the light emitting structure 120 and the first wavelength converter 210. In addition, the second wavelength converter 230 may be formed to a substantially uniform thickness on the translucent layer 220. The second wavelength converter 230 may include an upper surface with increased roughness, and may further include a roughness pattern on the upper surface thereof. Accordingly, light extraction efficiency with respect to light escaping from the second wavelength converter 230 can be improved while enabling control of the beam angle of the light emitting element.

Although the thickness of the second wavelength converter 230 is not limited to a particular value, the second wavelength converter 230 may have a thickness that can minimize deterioration in luminous efficacy due to absorption of light emitted from the light emitting structure 120 while maintaining a predetermined degree or more of wavelength conversion efficiency. In addition, the second wavelength converter 230 may have a smaller thickness than the translucent layer 220. For example, the second wavelength converter 230 may have a thickness of about 20 μm to 200 μm. Within this thickness range of the second wavelength converter 230, it is possible to prevent deterioration in luminous efficacy due to absorption of light by the second wavelength converter 230 while preventing light having passed through the second wavelength converter 230 from being converted into light having numerical values deviating from a target wavelength band, color temperature, or others.

The wafer W1 is divided into a plurality of individual light emitting elements along device dicing lines L1 shown in FIG. 19, thereby providing light emitting elements, as shown in FIG. 20A, in which the side surface of the first wavelength converter 210 is substantially flush with the insulating supporter 180.

On the other hand, in the exemplary embodiment described above, the translucent layer 220 is formed after formation of the first wavelength converter 210, and then the second wavelength converter 230 is formed. However, it should be understood that other implementations are also possible, and the processes of forming the first wavelength converter 210, the translucent layer 220 and the second wavelength converter 230 may overlap. For example, with the first wavelength converter 210 formed on the light emitting structure 120 through coating or deposition, the translucent layer 220 is formed in a non-cured state and then the second wavelength converter 230 is formed without curing the translucent layer 220, followed by simultaneously curing the first wavelength converter 210, the translucent layer 220, and the second wavelength converter 230.

The light emitting element according to this exemplary embodiment will be described in more detail with reference to FIG. 20A. Referring to FIG. 20A, the light emitting element includes: the light emitting structure 120, which includes the first conductive type semiconductor layer 121, the second conductive type semiconductor layer 125, and the active layer 123 interposed between the first conductive type semiconductor layer 121 and the second conductive type semiconductor layer 125; the first and second contact electrodes 130, 140; the insulating layers including the first insulating layer 150 and/or the second insulating layer 160; the first bulk electrode 171; the second bulk electrode 173; the insulating supporter 180; the first wavelength converter 210; the translucent layer 220; and the second wavelength converter 230. In addition, the light emitting element may further include the first and second pad electrodes 191, 193. The light emitting element can emit white light having a CIEx value of 0.390 or more in the CIE standard chromaticity coordinates. The components of the light emitting element according to this exemplary embodiment are substantially the same as those described with reference to FIG. 1 to FIG. 19 and detailed descriptions thereof will be omitted. The light emitting element includes the first wavelength converter 210 and the second wavelength converter 230 spaced apart from each other, thereby providing good luminous efficacy, particularly, good efficiency with respect to warm white.

For a light emitting element including only phosphors formed by conformal coating, it is necessary to use a relatively large amount of phosphors in order to realize white light having a relatively low correlated color temperature (CCT), that is, warm white having a CIEx value of about 0.4 or more. Thus, it is necessary to form the conformal-coated phosphor layer to a thickness of greater than about 200 μm or to form the phosphor layer having a high density. However, in such a case, light emitted from the light emitting structure (blue light or UV light) can be subjected to wavelength conversion to be absorbed by the phosphor layer instead of escaping from the phosphor layer, or can be subjected to excessive wavelength conversion, thereby causing deterioration in luminous efficacy.

Figure 30:
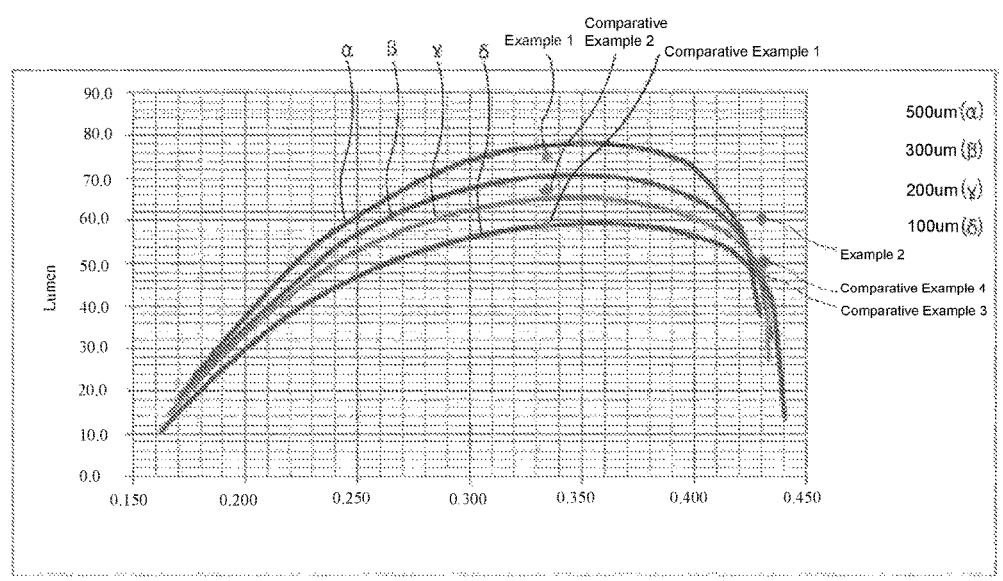
FIG. 30 is a graph comparing luminous efficacy of examples and comparative examples.

For example, the graph of FIG. 30 shows emission intensity according to CIEx value. In the graph of FIG. 30, Lines α, β, γ, and δ show emission intensities according to CIEx value upon application of a phosphor layer having a thickness of 500 μm, 300 μm, 200 μm or 100 μm. Referring to FIG. 30, as the thickness of the phosphor layer increases, deterioration in luminous efficacy becomes severe with increasing CIEx value in the warm white region, particularly at a CIEx value of 0.350 or more.

In addition, when the phosphor layer is formed in the form of the remote phosphor, wavelength conversion is not uniformly performed, thereby causing deviation in light emission characteristics between manufactured light emitting elements.

The light emitting element according to this exemplary embodiment includes the first wavelength converter 210 formed by conformal coating, the second wavelength converter 230 spaced apart from the first wavelength converter 210, and the translucent layer 220 interposed between the first wavelength converter 210 and the second wavelength converter 230, thereby providing better luminous efficacy, particularly with respect to white light having a CIEx value of 0.39 or more, than typical light emitting elements.

Figure 29:
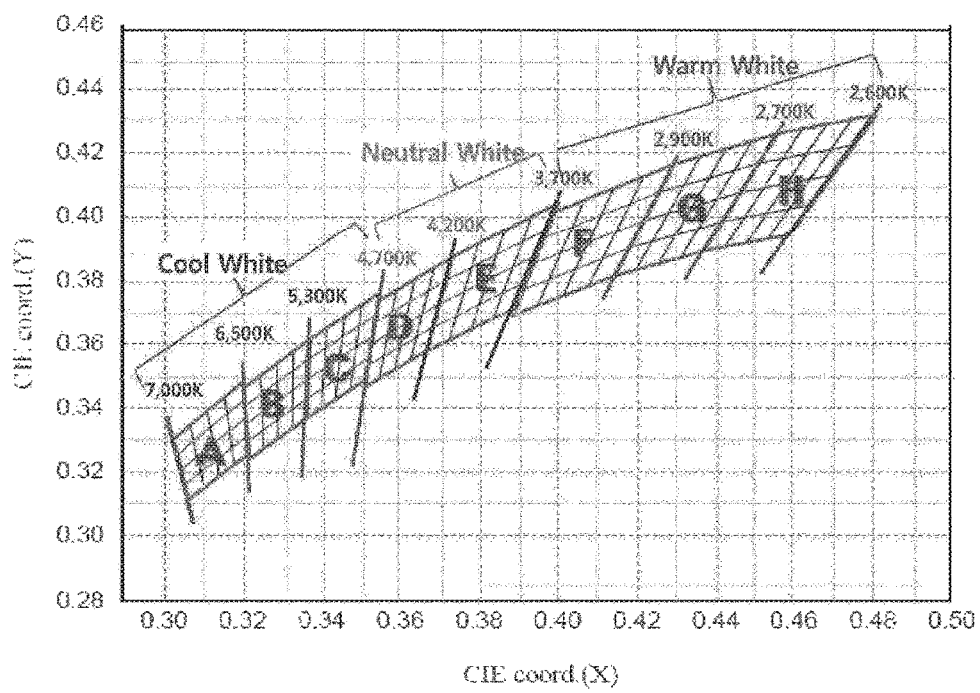
FIG. 29 is a graph depicting the CIE standard chromaticity coordinates and color temperature of light emitted from light emitting elements according to exemplary embodiments of the present disclosure.

For example, the color temperature of white light emitted from the light emitting element shown in FIG. 20A will be described in more detail with reference to FIG. 29. When blue light is emitted from the light emitting structure 120, the blue light is subjected to wavelength conversion by the first wavelength converter 210 such that white light of cool white and/or neutral white can be emitted from the first wavelength converter 210. Then, the light emitted from the first wavelength converter 210 passes through the translucent layer 220 and is subjected to wavelength conversion again by the second wavelength converter 230. In particular, since a light component increasing the color temperature of white light (light in a relatively short wavelength band) among components of light emitted from the first wavelength converter 210 is highly likely to be subjected to wavelength conversion by the second wavelength converter 230, the white light emitted from the second wavelength converter 230 can have a lower color temperature than the white light emitted from the first wavelength converter 210. Finally, since the fractions of light emitted through the first and second wavelength converters 210, 230 are relatively high among all components of the light emitted from the light emitting element, the light emitted from the light emitting element has a lower color temperature than the white light subjected to wavelength conversion by each of the first and second wavelength converters 210, 230. Here, since each of first and second wavelength converters 210, 230 can have a thickness of about 20 µm to 200 µm, it is possible to effectively prevent loss of light through absorption of the light by the first and second wavelength converters 210, 230. In conclusion, according to the exemplary embodiment, the light emitting element can emit white light having a color temperature similar to the color temperature realized by typical light emitting elements while improving luminous efficacy to provide high emission intensity.

It should be understood that the light emitting elements according to the exemplary embodiments are not limited to a light emitting element emitting warm white light and can also improve luminous efficacy of a light emitting element emitting cool white light and neutral white light.

Furthermore, the light emitting element may be fabricated in a wafer level package including the first bulk electrode 171, the second bulk electrode 173, and the insulating supporter 180, and the first and second wavelength converters 210, 230 may also be formed at the wafer level. As a result, it is possible to provide a miniaturized light emitting element with good wavelength conversion efficiency and good luminous efficacy. In addition, since a plurality of light emitting elements can be manufactured through a device dividing process after forming the wavelength converters at the wafer level, the method of manufacturing the light emitting element can be simplified. Furthermore, since the first wavelength converter 210 is formed to cover the side surfaces of the light emitting structure 120 while contacting the insulating supporter 180 in order to improve wavelength conversion efficiency with respect to light emitted from the side surfaces of the light emitting structure 120, it is possible to minimize a deviation in optical characteristics between the light emitting elements manufactured by blocking light emitted without passing through the wavelength converters.

Although the above exemplary embodiments provide the light emitting element including the first and second wavelength converters 210, 230 and two wavelength converters and the method of manufacturing the same, it should be understood that other implementations are also possible. In other exemplary embodiments, the light emitting element may further include at least one additional wavelength converter disposed on the second wavelength converter 230. The additional wavelength converter may be spaced apart from the second wavelength converter 230 and, in this case, an additional translucent layer may be interposed between the additional wavelength converter and the second wavelength converter 230. The additional wavelength converter may be spaced apart from the second wavelength converter 230 and, in this case, an additional translucent layer may be further interposed between the wavelength converter and the second wavelength converter 230. For a light emitting element including a plurality of additional wavelength converters, additional translucent layers may be further interposed between the additional wavelength converters to be separated from each other.

Figure 20B:
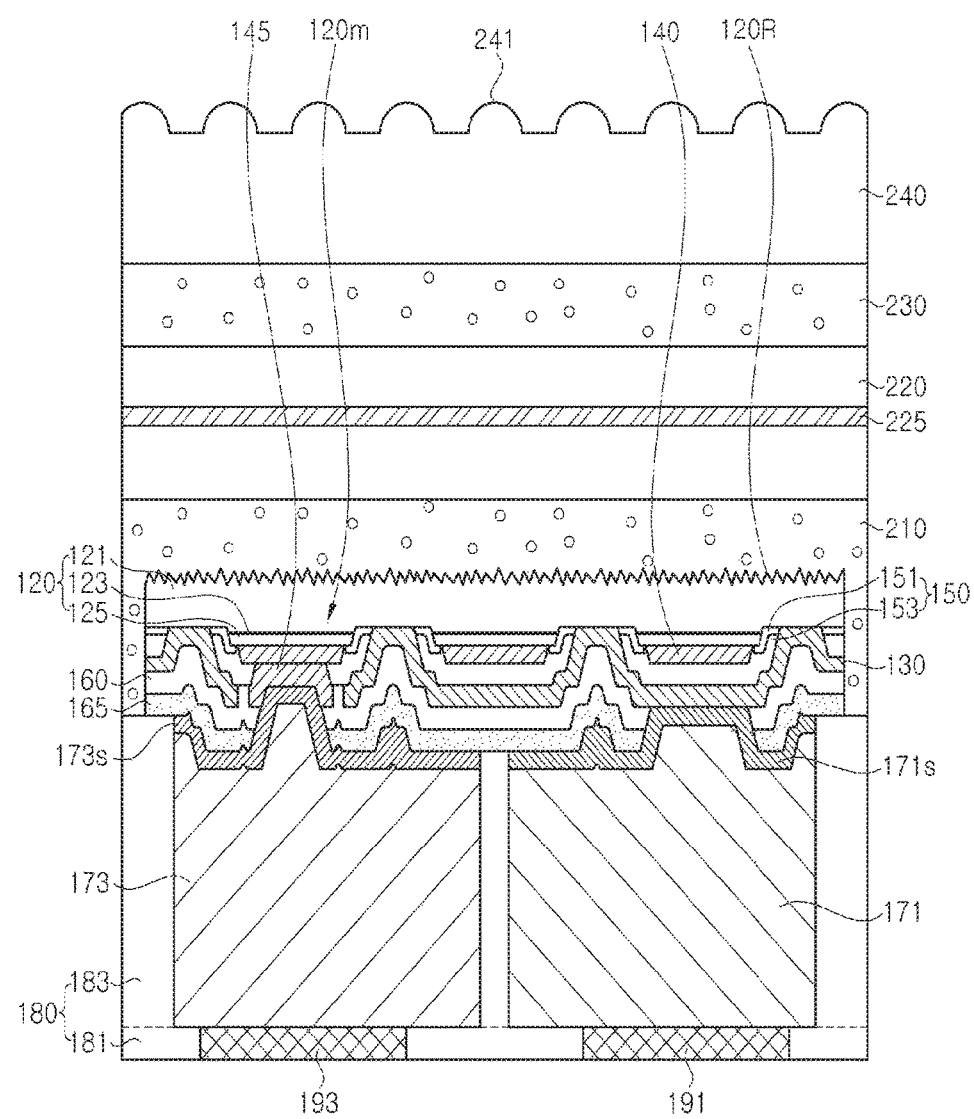
FIG. 20B is a cross-sectional view illustrating a light emitting element and a method of manufacturing the same according to another exemplary embodiment of the present disclosure.

In various other exemplary embodiments, the light emitting element may further include an additional translucent layer 240 disposed on the second wavelength converter 230, as shown in FIG. 20B. The additional translucent layer 240 may include at least one of silicon, a silicon compound, a translucent polymer, and a translucent ceramic. The additional translucent layer 240 and the translucent layer 220 may be formed of or include the same material or different materials. For example, the additional translucent layer 240 may be formed of or include a material having a smaller index of refraction than the second wavelength converter 230. In this structure, a refractive index grading layer may be formed to improve light extraction efficiency of the light emitting element. The additional translucent layer 240 may be formed on the second wavelength converter 230 before the process of dicing the wafer into individual devices.

Figure 20C:
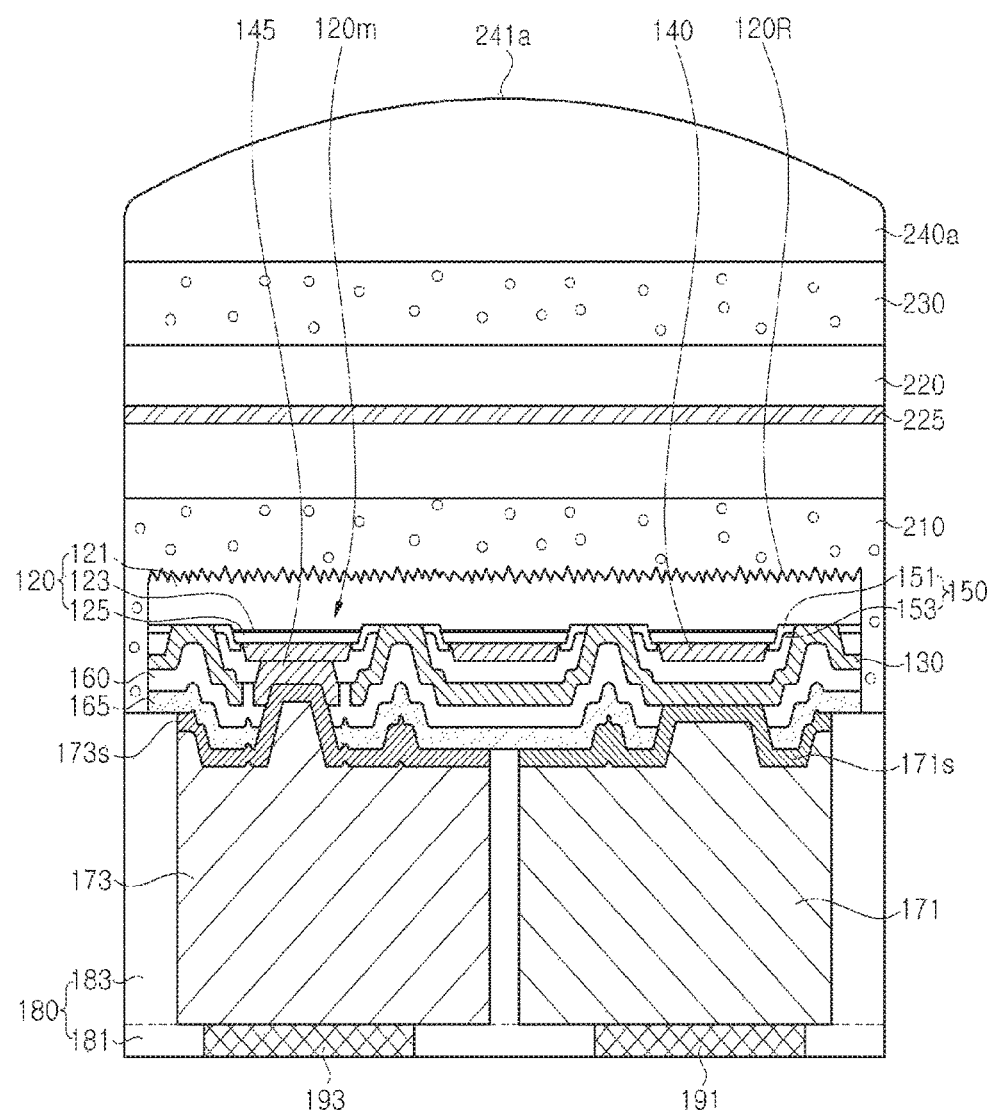
FIG. 20C is a cross-sectional view illustrating a light emitting element and a method of manufacturing the same according to a further exemplary embodiment of the present disclosure.

The additional translucent layer 240 may be disposed on the second wavelength converter 230 to act as a lens. An upper surface of the additional translucent layer 240 may include at least one of a flat surface, a convex surface, and a concave surface. Further, the additional translucent layer 240 may include at least one protrusion 241 formed on the upper surface thereof. As shown in FIG. 20C, the additional translucent layer 240 may include a plurality of protrusions 241. The protrusions 241 may act as micro-lenses and may have a hemispherical shape, as shown in FIG. 20C, without being limited thereto. The protrusions 241 may be formed on the upper surface of the additional translucent layer 240 through imprinting, photolithography and etching, or others. The protrusions 241 on the additional translucent layer 240 can enhance luminous efficacy of the light emitting element by scattering light emitted through the additional translucent layer 240 or by reducing total reflection of the light. Further, in other exemplary embodiments, the additional translucent layer 240a includes a convex surface 241a, which may be formed over the entire surface of the light emitting element, as shown in FIG. 20C. That is, the protrusions 241 on the additional translucent layer 240 may be provided in plural to form a plurality of hemispherical micro-lenses having a plurality of central points, or alternatively, the additional translucent layer 240a may include a single convex surface 241a having a central point substantially corresponding to the center of the light emitting element to form a single hemispherical micro-lens.

Figure 20D:
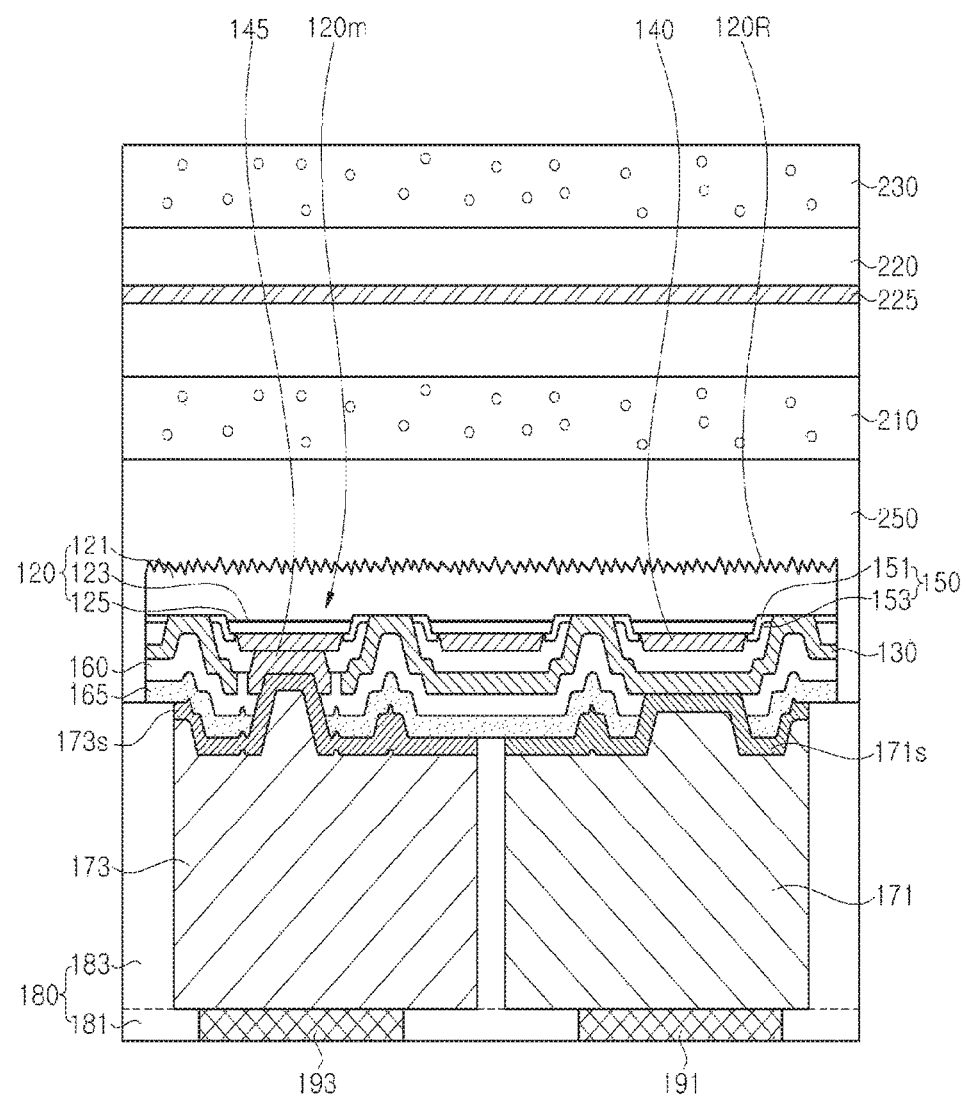
FIG. 20D is a cross-sectional view illustrating a light emitting element and a method of manufacturing the same according to yet another exemplary embodiment of the present disclosure.

Further, in other exemplary embodiments, the light emitting element may further include a lower translucent layer 250. Referring to FIG. 20D, the light emitting element may further include the lower translucent layer 250 disposed under the first wavelength converter 210. The lower translucent layer 250 may be disposed on the upper surface of the light emitting structure 120 and further cover the side surfaces of the light emitting structure 120. In addition, the lower translucent layer 250 may contact the insulating supporter 180. The lower translucent layer 250 may be formed of or include a light transmitting material, and may include silicon, a silicon compound, a translucent polymer, or a translucent ceramic. In addition, the translucent layer 220 and the lower translucent layer 250 may be formed of or include the same material or different materials. The lower translucent layer may further include light scattering particles.

FIG. 21 to FIG. 28 are cross-sectional views illustrating light emitting elements and a method of manufacturing the same according to other exemplary embodiments of the present disclosure.

The light emitting element according to the other exemplary embodiments and the method of manufacturing the same described with reference to FIG. 21 to FIG. 28 are different from the light emitting element according to the exemplary embodiment and the method of manufacturing the same described with reference to FIG. 1 to FIG. 20A in terms of the first wavelength converter 210 and the process of forming the same. The following description will focus on the different feature and detailed description of the same components will be omitted.

Figure 21:
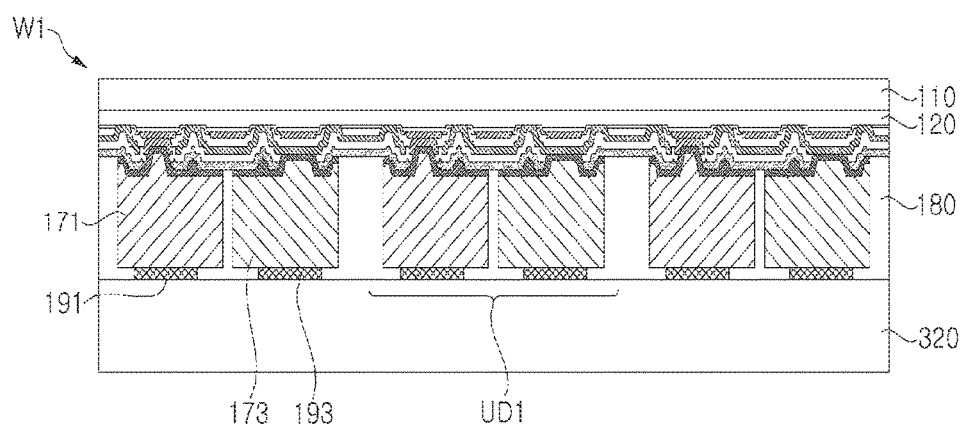
FIG. 21 to FIG. 28 are cross-sectional views illustrating light emitting elements and a method of manufacturing the same according to other exemplary embodiments of the present disclosure.
Figure 22:
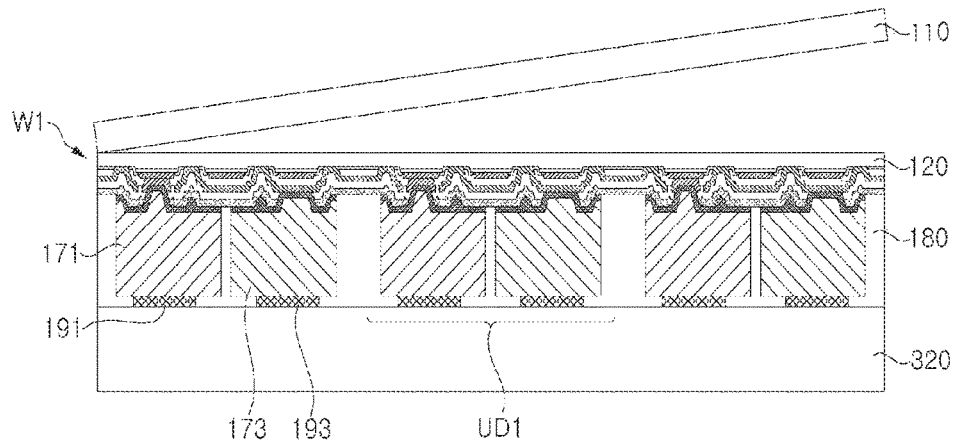
Figure 23:
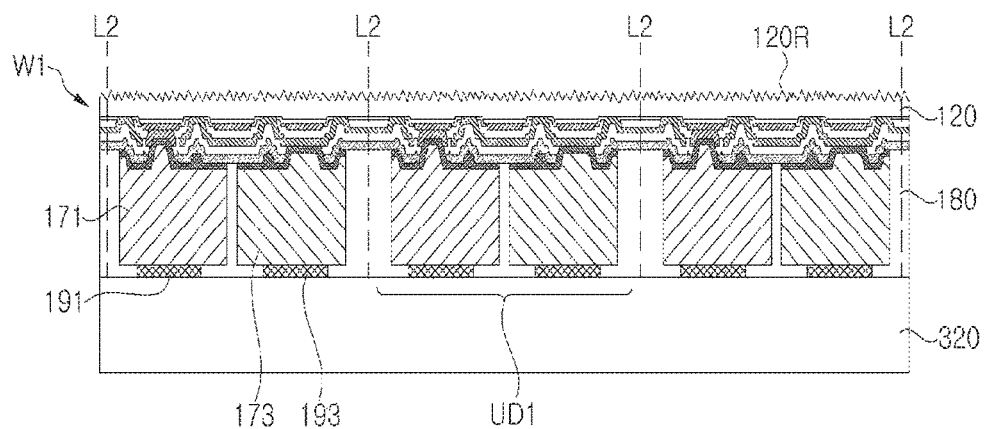

Referring to FIG. 21 and FIG. 22, with the wafer W1 placed on a temporary substrate 320, the growth substrate 110 is separated from the light emitting structure 120, as in FIG. 13 and FIG. 14. Then, referring to FIG. 23, the wafer W1 is divided along device dicing lines L1 to isolate a plurality of unit device regions UD1 from each other. Division of the wafer W1 may be carried out by etching.

Figure 24:
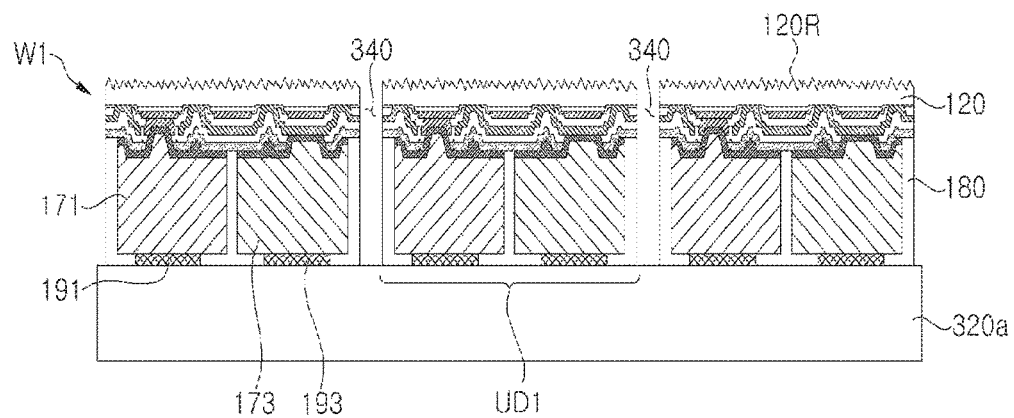

Then, referring to FIG. 24, a plurality of unit device regions UD1 isolated from each other are placed on another temporary substrate 320a to be spaced apart from each other. Here, the space between the unit device regions UD1 can be defined as a device separation space 340.

Figure 25:
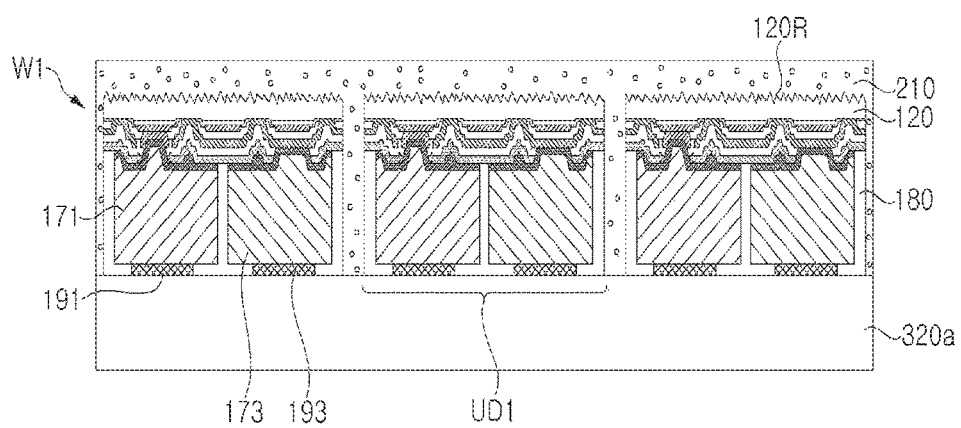

Next, referring to FIG. 25, a first wavelength converter 210 is formed on the light emitting structure 120. The first wavelength converter 210 fills the device separation space 340 and thus covers side surfaces of each of the unit device regions UD1. The first wavelength converter 210 may be formed by a process, such as deposition, spraying, coating, and curing. As a result, the first wavelength converter 210 covering the entire side surfaces of the light emitting element and formed by conformal coating can be provided. In addition, the thickness of the first wavelength converter 210 covering the side surfaces of the light emitting element can be determined depending on the width of the device separation space 340.

Figure 26:
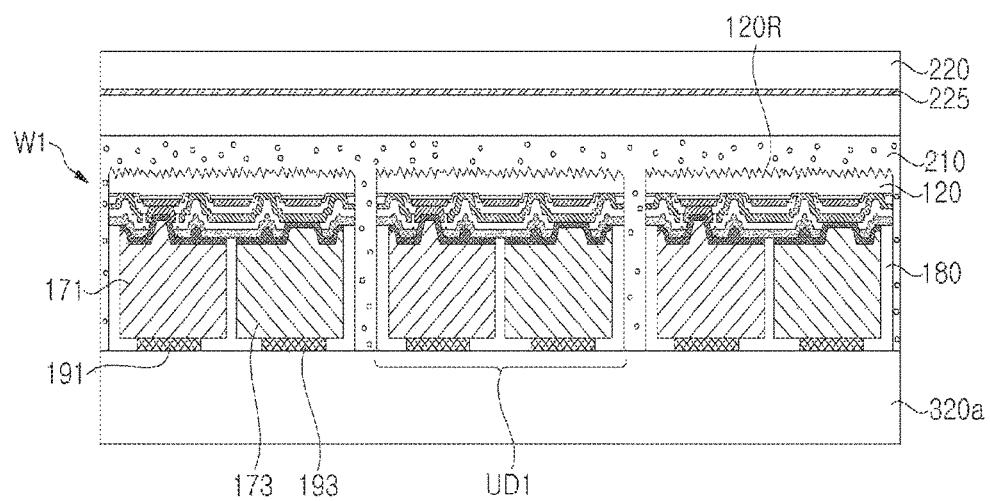
Figure 27:
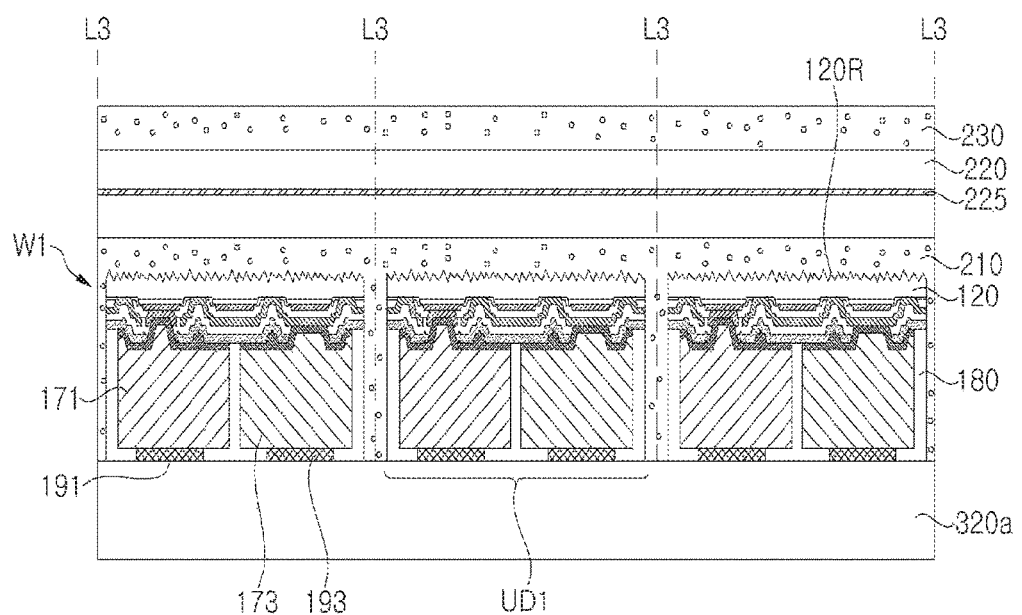
Figure 28:
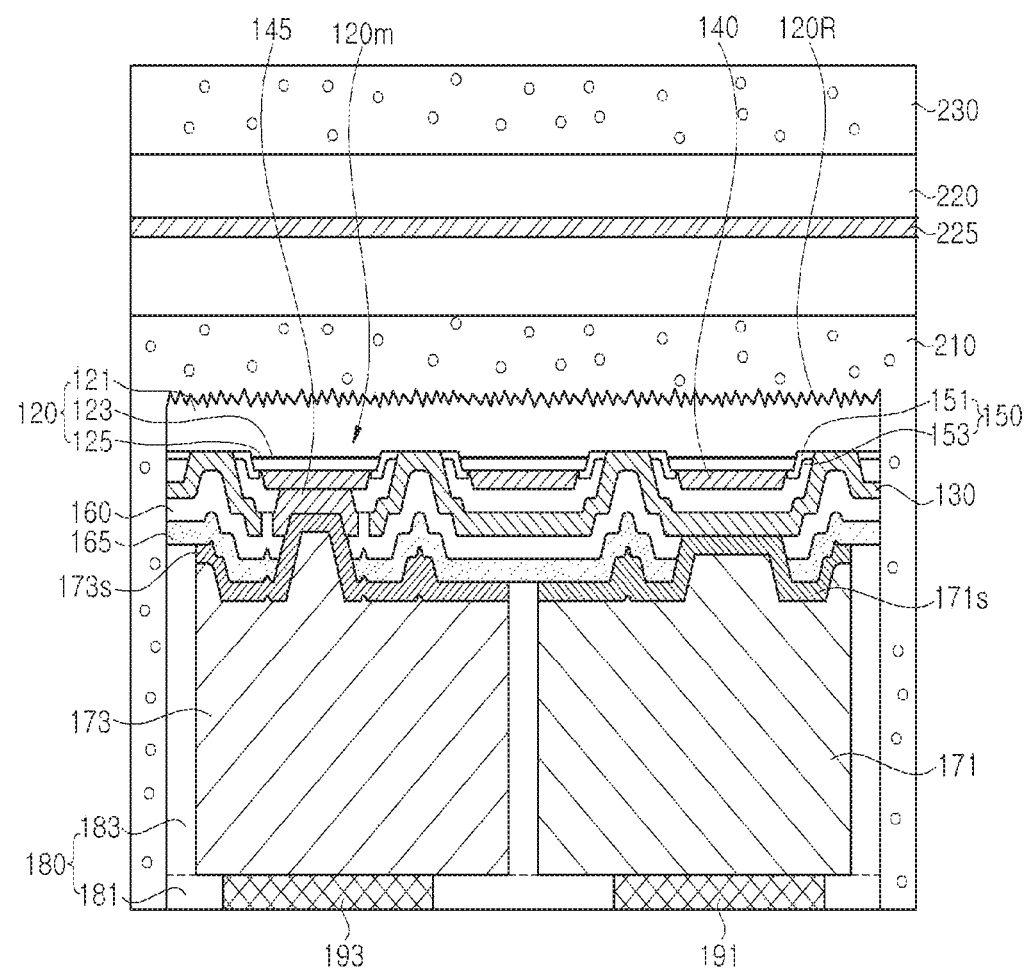

Next, referring to FIG. 26 and FIG. 27 together with FIG. 18, a translucent layer 220 is formed on the first wavelength converter 210 and a second wavelength converter 230 is formed on the translucent layer 220. Then, the first wavelength converter 210, the translucent layer 220, and the second wavelength converter 230 are diced into plurality of individual light emitting elements along a second device dicing line L3, thereby providing light emitting elements as shown in FIG. 28. Each of the light emitting elements shown in FIG. 28 may include the first wavelength converter 210 covering the side surfaces of the insulating supporter 180. A lower surface of the first wavelength converter 210 may be substantially flush with a lower surface of the insulating supporter 180.

According to the exemplary embodiments, the first wavelength converter 210 is formed to cover the side surfaces of the insulating supporter 180 to prevent light from being emitted from the light emitting element without wavelength conversion through the insulating supporter 180. Accordingly, the light emitting element according to the exemplary embodiments can have further improved wavelength conversion efficiency. Furthermore, in the method of manufacturing the light emitting element according to the exemplary embodiments, the first wavelength converter 210, the translucent layer 220 and the second wavelength converter 220 can be simultaneously formed with respect to a plurality of unit device regions UD1 separated from each other, thereby simplifying the manufacturing method of the light emitting element.

Experimental Example

In this experimental example, light emitting elements of examples, each of which includes first and second wavelength converters 210, 230, were compared with light emitting elements of comparative examples, each of which includes a single wavelength converter. Table 1 shows the structures of the light emitting elements of Examples 1 and 2 and Comparative Examples 1 to 4 and emission intensities thereof, FIG. 30 is a graph depicting the emission intensities of the light emitting elements of Examples 1 and 2 and Comparative Examples 1 to 4. The light emitting elements of Examples 1 and 2 and Comparative Examples 1 to 4 have a similar structure to the light emitting element shown in FIG. 20A except for the structure of the wavelength converter.

TABLE 1

|  | CIEx | Luminous Flux [lm] | Phosphor density [1/m$^3$] | Thickness of wavelength converter [μm] | Thickness of translucent layer [μm] | Relative luminous efficacy | Remark |
|---|---|---|---|---|---|---|---|
| Comparative Example 1 | 0.334 | 59.1 | 40,000 | 100 |  | 100% | Including first wavelength converter alone |
| Comparative Example 2 | 0.334 | 67.1 | 40,000 | 100 | 300 | 114% (to Comparative Example 1) | Including both first wavelength converter and translucent layer |
| Example 1 | 0.334 | 75 | 20,000 | 100 | 300 | 127% (to Comparative Example 1) | Including first and second wavelength converter, and translucent layer |
| Comparative Example 3 | 0.43 | 47.2 | 140,000 | 100 |  | 100% | Including first wavelength converter alone |
| Comparative Example 4 | 0.431 | 50.3 | 140,000 | 100 | 300 | 107% (to Comparative Example 3) | Including first wavelength converter and translucent layer |
| Example 2 | 0.43 | 60.6 | 74000 | 100 | 300 | 128% (to Comparative Example 3) | Including first and second wavelength converters, and translucent layer |

First, comparing Comparative Examples 1 and 2 with Example 1, it could be seen that the light emitting element of Example 1 had 27% higher emission intensity than the light emitting element of Comparative Example 1 including the first wavelength converter 210 alone. Specifically, it could be seen that the phosphor density of the light emitting element of Example 1 was merely about 50% the phosphor density of each of the light emitting elements of Comparative Examples 1 and 2, thereby improving luminous efficacy through suppression of light absorption by the wavelength converter. In addition, although the phosphor density of the light emitting element of Example 1 was decreased to 50% the phosphor density of the light emitting elements of Comparative Examples 1 and 2, the CIEx values of all of these light emitting elements were substantially similar, that is, about 0.334. Thus, it could be seen that white light emitted from each of the light emitting elements of Example 1 and Comparative Examples 1 and 2 was cool white light having a similar color temperature. Referring to FIG. 30, it could be seen that the light emitting element of Example 1 emitted light having a higher luminous flux, when compared with Line 6 indicating luminous efficacy according to CIEx value in application of a wavelength converter having a thickness of 100 μm.

Next, comparing Comparative Examples 3 and 4 with Example 2, it could be seen that the light emitting element of Example 2 had 28% higher emission intensity than the light emitting element of Comparative Example 3 including the first wavelength converter 210 alone. Specifically, it could be seen that the phosphor density of the light emitting element of Example 2 was merely about 53% the phosphor density of each of the light emitting elements of Comparative Examples 3 and 4, thereby improving luminous efficacy through suppression of light absorption by the wavelength converter. In addition, although the phosphor density of the light emitting element of Example 2 was decreased to 53% the phosphor density of the light emitting elements of Comparative Examples 3 and 4, the CIEx values of all of these light emitting elements were substantially similar, that is, about 0.43. Thus, it could be seen that white light emitted from each of the light emitting elements of Example 2 and Comparative Examples 3 and 4 was warm white light having a similar color temperature. Referring to FIG. 30, it could be seen that the light emitting element of Example 2 emitted light having a higher luminous flux, when compared with Line 6 indicating luminous efficacy according to CIEx value in application of a wavelength converter having a thickness of 100 μm In the aforementioned experimental example, it could be seen that the light emitting elements of Examples emitted light having a similar color temperature to light emitted from the light emitting elements of Comparative Examples while providing improved luminous efficacy. Furthermore, when compared with Line a indicating luminous efficacy according to CIEx value in application of a wavelength converter having a thickness of 500 μm, light emitted from the light emitting element of Example 1 at a CIEx value of 0.334 had a lower luminous flux and light emitted from the light emitting element of Example 2 at a CIEx value of 0.43 had a higher luminous flux than light emitted from a light emitting element including the wavelength converter having a thickness of 500 μm. That is, it could be seen that the configuration including the first and second wavelength converters according to the exemplary embodiments of the present disclosure was more effective for a light emitting element that emits warm white light at a relatively low color temperature.

Figure 31:
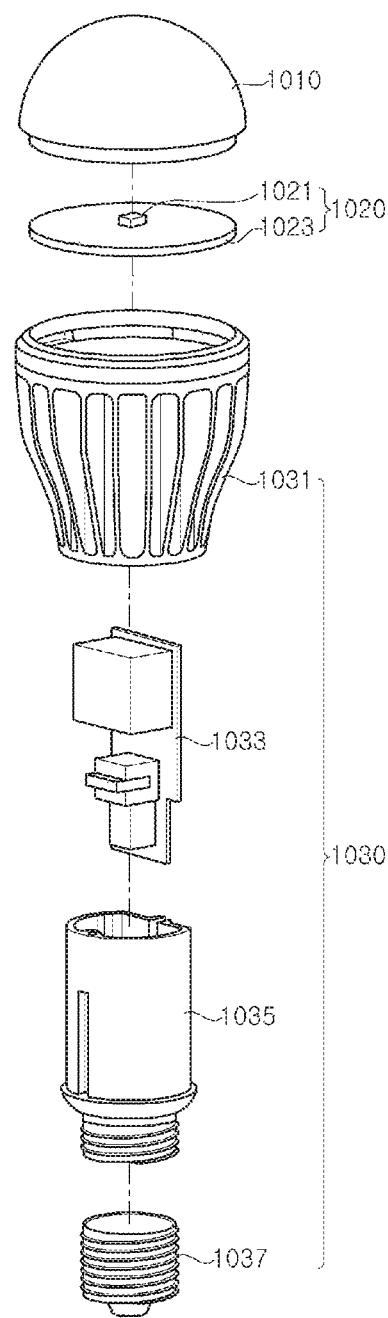
FIG. 31 is an exploded perspective view of one embodiment of a lighting apparatus to which a light emitting element according to one exemplary embodiment of the present disclosure is applied.

FIG. 31 is an exploded perspective view of one embodiment of a lighting apparatus to which a light emitting element according to one exemplary embodiment is applied.

Referring to FIG. 31, the lighting apparatus according to this embodiment includes a diffusive cover 1010, a light emitting module 1020, and a body 1030. The body 1030 may receive the light emitting module 1020 and the diffusive cover 1010 may be disposed on the body 1030 to cover an upper side of the light emitting module 1020.

The body 1030 may have any shape so long as the body can supply electric power to the light emitting module 1020 while receiving and supporting the light emitting module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting module 1020, and may include at least one IC chip. The IC chip may regulate, change or control electric power supplied to the light emitting module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting module 1020 includes a substrate 1023 and a light emitting element 1021 disposed on the substrate 1023. The light emitting module 1020 may be disposed at an upper portion of the body case 1031 and electrically connected to the power supply 1033.

As the substrate 1023, any substrate capable of supporting the light emitting element 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting element 1021 may include at least one of the light emitting elements according to the exemplary embodiments described above.

The diffusive cover 1010 is disposed on the light emitting element 1021 and may be secured to the body case 1031 to cover the light emitting element 1021. The diffusive cover 1010 may be formed of or include a light transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 32:
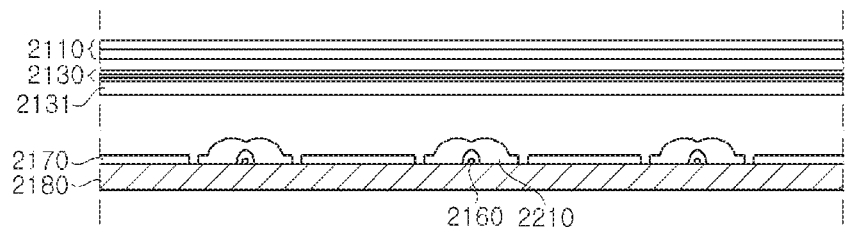
FIG. 32 is a cross-sectional view of one embodiment of a display to which a light emitting element according to one exemplary embodiment of the present disclosure is applied.

FIG. 32 is a cross-sectional view of one embodiment of a display apparatus to which a light emitting element according to one exemplary embodiment of the present disclosure is applied.

The display apparatus according to this embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting elements 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting elements 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting elements 2160 may include at least one of the light emitting elements according to the exemplary embodiments described above. The light emitting elements 2160 may be regularly arranged in a predetermined pattern on the substrate. In addition, a lens 2210 may be disposed on each of the light emitting elements 2160 to improve uniformity of light emitted from the plurality of light emitting elements 2160.

The diffusive plate 2131 and the optical sheets 2130 are disposed above the light emitting element 2160. Light emitted from the light emitting elements 2160 may be supplied in the form of sheet light to the display panel 2110 through the diffusive plate 2131 and the optical sheets 2130.

In this way, the light emitting elements according to the exemplary embodiments may be applied to direct type displays like the display apparatus according to this embodiment.

Figure 33:
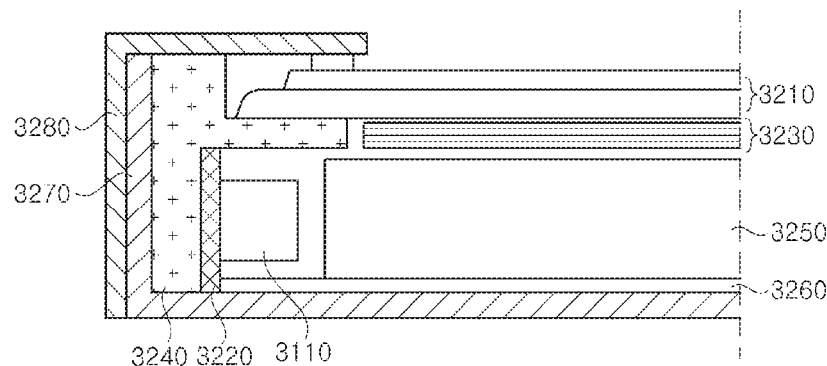
FIG. 33 is a cross-sectional view of another embodiment of a display to which a light emitting element according to one exemplary embodiment of the present disclosure is applied.

FIG. 33 is a cross-sectional view of another embodiment of the display apparatus to which a light emitting element according to one exemplary embodiment of the present disclosure is applied.

The display apparatus according to this embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit BLU2.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting elements 3110 arranged at constant intervals on one surface of the substrate 3220. As the substrate 3220, any substrate capable of supporting the light emitting elements 3110 and being electrically connected thereto may be used without limitation. For example, the substrate 3220 may include a printed circuit board. The light emitting elements 3110 may include at least one of the light emitting elements according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting elements 3110 into sheet light.

The light emitting elements according to the exemplary embodiments may be applied to edge type displays like the display apparatus according to this exemplary embodiment.

Figure 34:
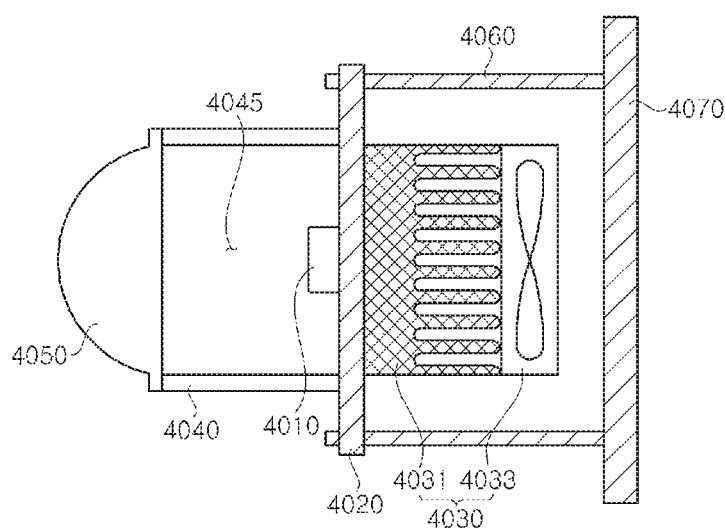
FIG. 34 is a cross-sectional view of a headlight to which a light emitting element according to one exemplary embodiment of the present disclosure is applied.

FIG. 34 is a cross-sectional view of a headlight to which a light emitting element according to one exemplary embodiment of the present disclosure is applied.

Referring to FIG. 34, the headlight according to this embodiment includes a lamp body 4070, a substrate 4020, a light emitting element 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting element 4010 may be used without limitation. For example, the substrate 4020 may include a substrate having a conductive pattern, such as a printed circuit board. The light emitting element 4010 is disposed on the substrate 4020 and may be supported and secured by the substrate 4020. In addition, the light emitting element 4010 may be electrically connected to an external power source through the conductive pattern of the substrate 4020. Further, the light emitting element 4010 may include at least one of the light emitting elements according to the exemplary embodiments described above.

The cover lens 4050 is disposed on a path of light emitted from the light emitting element 4010. For example, as shown in the drawing, the cover lens 4050 may be spaced apart from the light emitting element 4010 by the connection member 4040 and may be disposed in a direction of supplying light emitted from the light emitting element 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting element 4010, and thus can act as a light guide that provides a luminous path 4045. The connection member 4040 may be formed of or include a light reflective material or coated therewith. The heat dissipation unit 4030 may include heat dissipation fins 4031 and/or a heat dissipation fan 4033 to dissipate heat generated upon operation of the light emitting element 4010.

The light emitting elements according to the exemplary embodiment may be applied to headlights, for example, headlights for vehicles.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is:

1. A light emitting element including a plurality of wavelength converters, the light emitting element comprising: a light emitting structure comprising a first conductive type semiconductor layer, a second conductive type semiconductor layer, and an active layer interposed between the first conductive type semiconductor layer and the second conductive type semiconductor layer; a first contact electrode and a second contact electrode disposed under the light emitting structure and forming ohmic contact with the first and second conductive type semiconductor layers, respectively; the first contact electrode overlapping with the second contact electrode; an insulating layer insulating the first contact electrode and the second contact electrode from each other and partially covering the first and second contact electrodes; a first bulk electrode and a second bulk electrode disposed under the light emitting structure and the insulating layer and electrically connected to the first and second contact electrodes, respectively; an insulating supporter covering side surfaces of the first bulk electrode and the second bulk electrode while at least partially exposing lower surfaces of the first bulk electrode and the second bulk electrode; a first wavelength converter covering at least part of a side surface and an upper surface of the light emitting structure; a translucent layer disposed on the first wavelength converter; and a second wavelength converter disposed on the translucent layer, wherein white light emitted from the light emitting element has a CIEx value of 0.390 or more in the CIE standard chromaticity coordinates, wherein the light emitting element further comprises: an additional translucent layer disposed on the second wavelength converter and comprising at least one protrusion formed at an upper side thereof.

2. The light emitting element according to claim 1, wherein the first wavelength converter partially adjoins the insulating supporter.

3. The light emitting element according to claim 2, wherein the first wavelength converter covers the side surface of the light emitting structure and adjoins at least one of the insulating layer and the first contact electrode, and a lower surface of a portion of the first wavelength converter covering the side surface of the light emitting structure adjoins the insulating supporter.

4. The light emitting element according to claim 3, wherein a side surface of the first wavelength converter is flush with a side surface of the insulating supporter.

5. The light emitting element according to claim 2, wherein the first wavelength converter extends to cover at least part of a side surface of the insulating supporter.

6. The light emitting element according to claim 5, wherein a lower surface of the first wavelength converter is flush with a lower surface of the insulating supporter.

7. The light emitting element according to claim 1, wherein a lower surface of a portion of the first wavelength converter covering the side surface of the light emitting structure adjoins at least one of the first contact electrode and the insulating layer.

8. The light emitting element according to claim 1, wherein the translucent layer comprises a distributed Bragg reflector.

9. The light emitting element according to claim 8, wherein the distributed Bragg reflector transmits light subjected to wavelength conversion by the first wavelength converter and light emitted from the light emitting structure while reflecting at least a fraction of light subjected to wavelength conversion by the second wavelength converter.

10. The light emitting element according to claim 1, wherein each of the first wavelength converter and the second wavelength converter has a thickness of 20 μm to 200 μm.

11. The light emitting element according to claim 10, wherein the translucent layer has a larger thickness than the first and second wavelength converters.

12. The light emitting element according to claim 1, wherein the light subjected to wavelength conversion by the second wavelength converter has a longer wavelength than the light subjected to wavelength conversion by the first wavelength converter.

* * * * *